United States Patent
Saito et al.

(10) Patent No.: US 11,856,802 B2
(45) Date of Patent: Dec. 26, 2023

(54) PHOTOELECTRIC CONVERSION ELEMENT AND METHOD OF MANUFACTURING PHOTOELECTRIC CONVERSION ELEMENT

(71) Applicants: SONY CORPORATION, Tokyo (JP); SONY SEMICONDUCTOR SOLUTIONS CORPORATION, Kanagawa (JP)

(72) Inventors: Yosuke Saito, Tokyo (JP); Sae Miyaji, Tokyo (JP); Masato Kanno, Tokyo (JP); Yasuharu Ujiie, Tokyo (JP); Yuta Hasegawa, Kanagawa (JP); Osamu Enoki, Kanagawa (JP); Yuki Negishi, Kanagawa (JP)

(73) Assignees: Sony Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 531 days.

(21) Appl. No.: 17/057,763

(22) PCT Filed: May 13, 2019

(86) PCT No.: PCT/JP2019/018924
§ 371 (c)(1),
(2) Date: Nov. 23, 2020

(87) PCT Pub. No.: WO2019/230354
PCT Pub. Date: Dec. 5, 2019

(65) Prior Publication Data
US 2021/0193740 A1    Jun. 24, 2021

(30) Foreign Application Priority Data
May 31, 2018  (JP) .................................. 2018-104374

(51) Int. Cl.
*H10K 39/32*        (2023.01)
*H10K 19/20*        (2023.01)
(Continued)

(52) U.S. Cl.
CPC .............. *H10K 39/32* (2023.02); *H10K 19/20* (2023.02); *H10K 30/30* (2023.02); *H10K 30/82* (2023.02);
(Continued)

(58) Field of Classification Search
CPC ........ H10K 39/32; H10K 19/20; H10K 30/30; H10K 30/82; H10K 71/164; H10K 85/211;
(Continued)

(56) References Cited

U.S. PATENT DOCUMENTS 11,711,975 B2 * 7/2023 Choi .................... H10K 85/655
2011/0036406 A1   2/2011 Okubo
(Continued)

FOREIGN PATENT DOCUMENTS

EP      1063197 A2    12/2000
JP      2008130889 A   6/2008
(Continued)

OTHER PUBLICATIONS

Bottari et al., "Covalent and Noncovalent Phthalocyanine-Carbon Nanostructure Systems: Synthesis, Photoinduced Electron Transfer, and Application to Molecular Photovoltaics," Chemical Reviews, vol. 110, May 4, 2010, pp. 6768-6816.
(Continued)

*Primary Examiner* — Douglas W Owens
(74) *Attorney, Agent, or Firm* — Sheridan Ross PC

(57) ABSTRACT

A first photoelectric conversion element according to an embodiment of the present disclosure incudes: a first electrode; a second electrode disposed to be opposed to the first
(Continued)

electrode; and a photoelectric conversion layer provided between the first electrode and the second electrode and including a chromophore, fullerene or a fullerene derivative, and a hole-transporting material, in which the chromophore and the fullerene or the fullerene derivative are bonded to each other at least partially via a crosslinking group in the photoelectric conversion layer.

18 Claims, 13 Drawing Sheets

(51) Int. Cl.
    *H10K 30/30*     (2023.01)
    *H10K 30/82*     (2023.01)
    *H10K 71/16*     (2023.01)
    *H01L 27/146*     (2006.01)
    *H10K 85/20*     (2023.01)
    *H10K 85/30*     (2023.01)
    *H10K 85/60*     (2023.01)

(52) U.S. Cl.
    CPC ...... *H10K 71/164* (2023.02); *H01L 27/14647* (2013.01); *H10K 85/211* (2023.02); *H10K 85/215* (2023.02); *H10K 85/311* (2023.02); *H10K 85/654* (2023.02); *H10K 85/6572* (2023.02); *H10K 85/6576* (2023.02)

(58) Field of Classification Search
    CPC .... H10K 85/215; H10K 85/85; H10K 85/311; H10K 85/654; H10K 85/6572; H10K 85/6576; H10K 85/322; H01L 7/14647; H01L 27/14612; H01L 27/14627; H01L 27/1464; H01L 27/14665; Y02E 10/549; Y02P 70/50; C09B 47/08

See application file for complete search history.

(56) References Cited

U.S. PATENT DOCUMENTS

| | | | |
|---|---|---|---|
| 2015/0069304 A1 | 3/2015 | Blouin | |
| 2016/0043318 A1 | 2/2016 | Yagi et al. | |
| 2016/0141500 A1 | 5/2016 | Jung | |
| 2018/0342683 A1* | 11/2018 | Negishi | H10K 85/311 |
| 2019/0081251 A1* | 3/2019 | Obana | H10K 39/30 |

FOREIGN PATENT DOCUMENTS

| | | |
|---|---|---|
| JP | 2011-009347 | 1/2011 |
| KR | 20130044660 A | 5/2013 |
| TW | 201638084 A | 11/2016 |
| WO | WO 2011/052341 | 5/2011 |
| WO | WO-2017035589 A1 | 3/2017 |
| WO | WO 2017-159025 | 9/2017 |

OTHER PUBLICATIONS

Rudolf et al., "Taming C60 Fullerene: Tuning Intramolecular Photoinduced Electron Transfer Process With Subphthalocyanines," Chemical Science, vol. 6, Apr. 16, 2015, pp. 4141-4147.

International Search Report and Written Opinion prepared by the Japanese Patent Office dated Jul. 18, 2019, for International Application No. PCT/JP2019/018924.

Carr Hoi Yi Ho et al., "Boosting the photovoltaic thermal stability of fullerene bulk heterojunction solar cells through charge transfer interactions", Journal of Material Chemistry A, Oct. 7, 2017, vol. 5, No. 45.

* cited by examiner

PHOTOELECTRIC CONVERSION ELEMENT AND METHOD OF MANUFACTURING PHOTOELECTRIC CONVERSION ELEMENT

CROSS REFERENCE TO RELATED APPLICATIONS

This application is a national stage application under 35 U.S.C. 371 and claims the benefit of PCT Application No. PCT/JP2019/018924 having an international filing date of 13 May 2019, which designated the United States, which PCT application claimed the benefit of Japanese Patent Application No. 2018-104374 filed 31 May 2018, the entire disclosures of each of which are incorporated herein by reference.

TECHNICAL FIELD

The present disclosure relates to, for example, a photoelectric conversion element using an organic material and a method of manufacturing the photoelectric conversion element.

BACKGROUND ART

A vacuum vapor deposition method or a coating method has been employed for manufacture of an organic moiety in an imaging element (organic photoelectric conversion element) using an organic material; the vacuum vapor deposition method is superior in the following points. First, the vacuum vapor deposition method enables patterning to be easily performed using a metal mask. In addition, the vacuum vapor deposition method forms a film by vaporizing or sublimating an organic material that is a vapor deposition material, and thus impurities derived from a solvent are not mixed thereinto. Further, it is not necessary to dissolve an organic material in a solvent as in the coating method, thus making it unnecessary to introduce a substituent soluble in the organic material.

Incidentally, the organic photoelectric conversion element has been required to have an enhanced photoelectric conversion efficiency. For example, PTL 1 discloses a photoelectric conversion element in which a photoelectric conversion efficiency and response characteristics are improved with use of two types of organic materials having different mother skeletons in addition to fullerene or a fullerene derivative as materials of a photoelectric conversion layer.

CITATION LIST

Patent Literature

PTL 1: International Publication No. WO 2016/194630

SUMMARY OF THE INVENTION

As described above, the organic photoelectric conversion element has been required to achieve a higher photoelectric conversion efficiency and higher response characteristics.

It is desirable to provide a photoelectric conversion element having superior photoelectric conversion characteristics and superior response characteristics and a method of manufacturing the photoelectric conversion element.

A first photoelectric conversion element according to an embodiment of the present disclosure incudes: a first electrode; a second electrode disposed to be opposed to the first electrode; and a photoelectric conversion layer provided between the first electrode and the second electrode and including a chromophore, fullerene or a fullerene derivative, and a hole-transporting material, in which the chromophore and the fullerene or the fullerene derivative are bonded to each other at least partially via a crosslinking group in the photoelectric conversion layer. A second photoelectric conversion element according to an embodiment of the present disclosure includes a first electrode; a second electrode disposed to be opposed to the first electrode; and a photoelectric conversion layer provided between the first electrode and the second electrode, in which the photoelectric conversion layer is formed, as a film, by a chromophore and fullerene or a fullerene derivative by means of a vacuum vapor deposition method, and the chromophore and the fullerene or the fullerene derivative are bonded to each other at least partially via a crosslinking group.

A method of manufacturing a first photoelectric conversion element according to an embodiment of the present disclosure includes: forming a first electrode; forming, on the first electrode, a photoelectric conversion layer that includes a chromophore, fullerene or a fullerene derivative, and a hole-transporting material, in which the chromophore and the fullerene or the fullerene derivative are bonded to each other at least partially via a crosslinking group; and forming a second electrode on the photoelectric conversion layer. A method of manufacturing a second photoelectric conversion element according to an embodiment of the present disclosure includes: forming a first electrode; forming, on the first electrode, a photoelectric conversion layer that includes a chromophore and fullerene or a fullerene derivative, in which the chromophore and the fullerene or the fullerene derivative are bonded to each other at least partially via a crosslinking group; and forming a second electrode on the photoelectric conversion layer.

In the first photoelectric conversion element, the method of manufacturing the first photoelectric conversion element, the second photoelectric conversion element, and the method of manufacturing the second photoelectric conversion element according to the respective embodiments of the present disclosure, the photoelectric conversion layer is formed which includes the chromophore, the fullerene or the derivative thereof, and the hole-transporting material and in which the chromophore and the fullerene or the fullerene derivative are bonded to each other at least partially via the crosslinking group. This optimizes energy levels of the fullerene or the derivative thereof, or orientations of the chromophore and the fullerene or the derivative thereof, and improves an electron transfer efficiency or an energy transfer efficiency between the chromophore and the fullerene or the derivative thereof. Further, generation of a trap at the interface is suppressed.

According to the first photoelectric conversion element, the method of manufacturing the first photoelectric conversion element, the second photoelectric conversion element, and the method of manufacturing the second photoelectric conversion element of the respective embodiments of the present disclosure, the photoelectric conversion layer is formed which includes the chromophore and the fullerene or the derivative thereof which are bonded to each other at least partially via the crosslinking group and the hole-transporting material, thus optimizing an energy level of the fullerene or the derivative thereof, or orientations of the chromophore and the fullerene or the derivative thereof. This improves an electron transfer efficiency or an energy transfer efficiency between the chromophore and the fullerene or the derivative thereof, and suppresses generation of a trap at the interface. Thus, it is possible to achieve a photoelectric conversion element having superior photoelectric conversion characteristics and response characteristics.

It is to be noted that the effects described herein are not necessarily limitative and may be any of the effects described in the present disclosure

MODES FOR CARRYING OUT THE INVENTION

Figure 1:
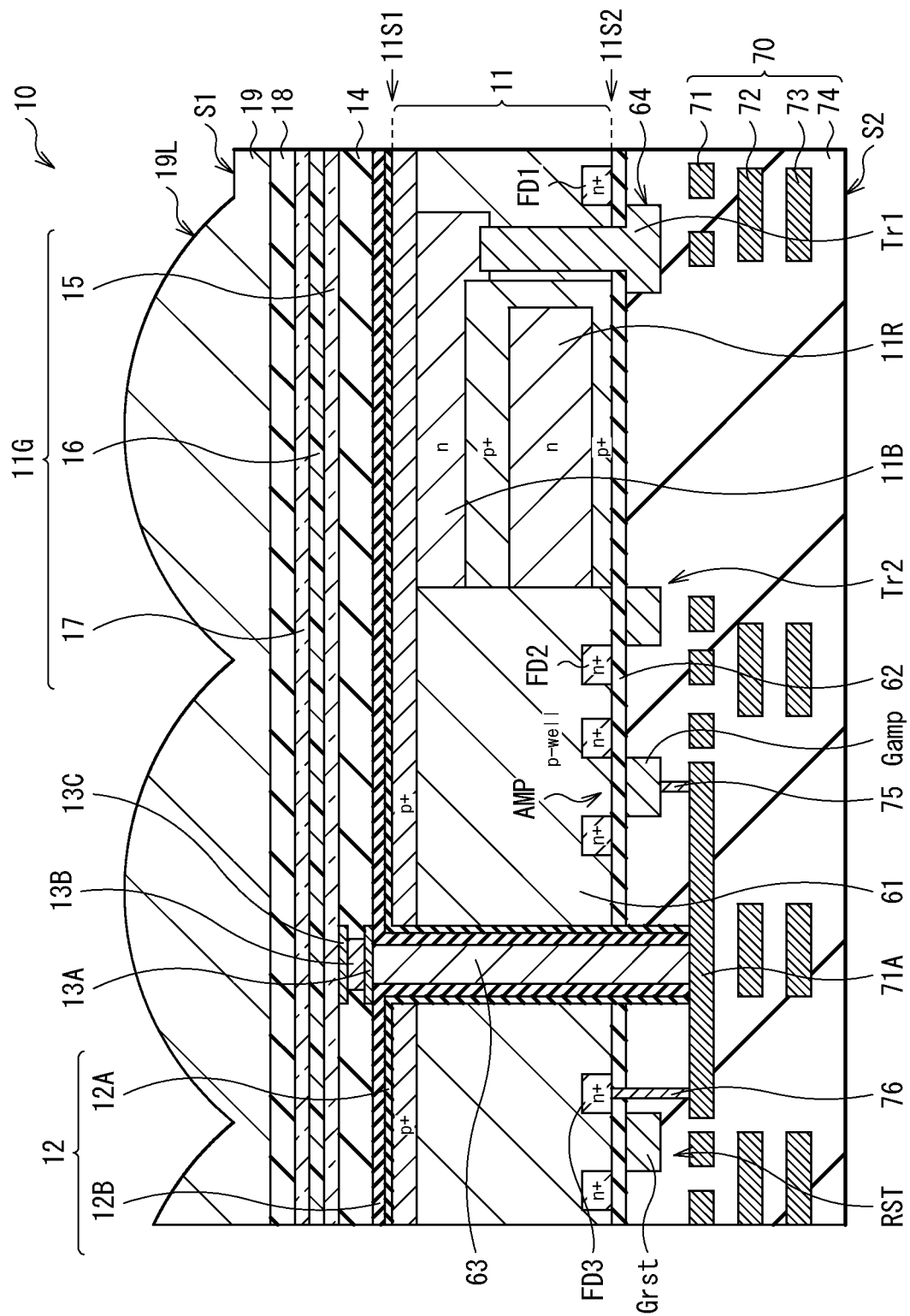
FIG. 1 is a schematic cross-sectional view of a configuration of a photoelectric conversion element according to an embodiment of the present disclosure.

In the following, description is given of embodiments of the present disclosure in detail with reference to the drawings. The following description is merely a specific example of the present disclosure, and the present disclosure should not be limited to the following aspects. Moreover, the present disclosure is not limited to arrangements, dimensions, dimensional ratios, and the like of each component illustrated in the drawings. It is to be noted that the description is given in the following order.

1. Embodiment (An example of a photoelectric conversion element in which a photoelectric conversion layer including a chromophore with a crosslinking group, fullerene or a derivative thereof, and a hole-transporting material is formed, as a film, using a vacuum vapor deposition method)
    1-1. Configuration of Photoelectric Conversion Element
    1-2. Method of Manufacturing Photoelectric Conversion Element
    1-3. Workings and Effects
2. Application Examples
3. Working Examples 1. Embodiment FIG. 1 illustrates a cross-sectional configuration of a photoelectric conversion element (a photoelectric conversion element 10) according to an embodiment of the present disclosure. The photoelectric conversion element 10 is, for example, an imaging element that configures one pixel (a unit pixel P) in an imaging device (an imaging device 1) such as a backside illumination type (backside light receiving type) CCD (Charge Coupled Device) image sensor or a CMOS (Complementary Metal Oxide Semiconductor) image sensor (see FIG. 7). The photoelectric conversion element 10 is of a so-called vertical spectroscopic type in which one organic photoelectric conversion section 11G and two inorganic photoelectric conversion sections 11B and 11R that selectively detect and photoelectrically convert light in different wavelength regions are stacked in a vertical direction. The organic photoelectric conversion section 11G of the present embodiment has a configuration in which a lower electrode 15, a photoelectric conversion layer 16, and an upper electrode 17 are stacked in this order. Although the detail is described later, the photoelectric conversion layer 16 includes a chromophore and fullerene or a derivative thereof, which are bonded together at least partially via a crosslinking group, and a hole-transporting material.

(1-1. Configuration of Photoelectric Conversion Element)

In the photoelectric conversion element 10, one organic photoelectric conversion section 11G and two inorganic photoelectric conversion sections 11B and 11R are stacked in the vertical direction for each unit pixel P. The organic photoelectric conversion section 11G is provided on side of a back surface (a first surface 11S1) of a semiconductor substrate 11. The inorganic photoelectric conversion sections 11B and 11R are each formed to be embedded in the semiconductor substrate 11, and are stacked in a thickness direction of the semiconductor substrate 11. The organic photoelectric conversion section 11G includes the photoelectric conversion layer 16 including a p-type semiconductor and an n-type semiconductor and having a bulk hetero junction structure in a layer. The bulk hetero junction structure is a p/n junction plane formed by mixing a p-type semiconductor and an n-type semiconductor.

The organic photoelectric conversion section 11G and the inorganic photoelectric conversion sections 11B and 11R selectively detect and photoelectrically convert light of different wavelength bands. Specifically, the organic photoelectric conversion section 11G acquires a green (G) color signal. The inorganic photoelectric conversion sections 11B and 11R acquire, respectively, blue (B) and red (R) color signals due to difference in absorption coefficients. This makes it possible for the photoelectric conversion element 10 to acquire a plurality of types of color signals in one pixel without using a color filter.

It is to be noted that description is give, in the present embodiment, of a case of reading holes as signal charges from a pair of electrons and holes generated by photoelectric conversion (a case of adopting a p-type semiconductor region as the photoelectric conversion layer). In addition, in the diagram, "+(plus)" attached to "p" and "n" indicates that p-type or n-type impurity concentration is high, and "++" indicates that the p type or n type impurity concentration is still higher than "+".

The semiconductor substrate 11 is configured by, for example, an n-type silicon (Si) substrate, and includes a p-well 61 in a predetermined region. A second surface (front surface of the semiconductor substrate 11) 11S2 of the p-well 61 is provided with, for example, various floating diffusions (floating diffusion layers) FD (e.g., FD1, FD2, and FD3), various transistors Tr (e.g., a vertical transistor (transfer transistor) Tr1, a transfer transistor Tr2, an amplifier transistor (modulation element) AMP, and a reset transistor RST), and a multilayer wiring line 70. The multilayer wiring line 70 has a configuration in which, for example, wiring layers 71, 72, and 73 are stacked in an insulating layer 74. In addition, a peripheral circuit (not illustrated) including a logic circuit or the like is provided in a peripheral part of the semiconductor substrate 11.

It is to be noted that, in FIG. 1, side of the first surface 11S1 of the semiconductor substrate 11 is denoted by a light incident surface S1, and side of the second surface 11S2 thereof is denoted by a wiring layer side S2.

The inorganic photoelectric conversion sections 11B and 11R are each configured by, for example, a PIN (Positive Intrinsic Negative) type photodiode, and each have a p-n junction in a predetermined region of the semiconductor substrate 11. The inorganic photoelectric conversion sections 11B and 11R enable light to be dispersed in the vertical direction by utilizing difference in wavelength bands to be absorbed depending on incidence depth of light in the silicon substrate.

The inorganic photoelectric conversion section 11B selectively detects blue light and accumulates signal charges corresponding to a blue color; the inorganic photoelectric conversion section 11B is installed at a depth at which the blue light is able to be efficiently subjected to photoelectric conversion. The inorganic photoelectric conversion section 11R selectively detects red light and accumulates signal charges corresponding to a red color; the inorganic photoelectric conversion section 11R is installed at a depth at which the red light is able to be efficiently subjected to photoelectric conversion. It is to be noted that blue (B) is a color corresponding to a wavelength band of 450 nm to 495 nm, for example, and red (R) is a color corresponding to a wavelength band of 620 nm to 750 nm, for example. It is sufficient for each of the inorganic photoelectric conversion sections 11B and 11R to be able to detect light of a portion or all of each wavelength band.

Specifically, as illustrated in FIG. 1, each of the inorganic photoelectric conversion section 11B and the inorganic photoelectric conversion section 11R includes, for example, a p+ region serving as a hole accumulation layer and an n region serving as an electron accumulation layer (having a p-n-p stacked structure). The n region of the inorganic photoelectric conversion section 11B is coupled to the vertical transistor Tr1. The p+ region of the inorganic photoelectric conversion section 11B bends along the vertical transistor Tr1 and is coupled to the p+ region of the inorganic photoelectric conversion section 11R.

As described above, the second surface 11S2 of the semiconductor substrate 11 is provided with, for example, the floating diffusions (floating diffusion layers) FD1, FD2, and FD3, the vertical transistor (transfer transistor) Tr1, the transfer transistor Tr2, the amplifier transistor (modulation element) AMP, and the reset transistor RST.

The vertical transistor Tr1 is a transfer transistor that transfers signal charges (here, holes), corresponding to a blue color and generated and accumulated in the inorganic photoelectric conversion section 11B, to the floating diffusion FD1. The inorganic photoelectric conversion section 11B is formed at a deep position from the second surface 11S2 of the semiconductor substrate 11, and thus the transfer transistor of the inorganic photoelectric conversion section 11B is preferably configured by the vertical transistor Tr1.

The transfer transistor Tr2 transfers signal charges (here, holes), corresponding to a red color and generated and accumulated in the inorganic photoelectric conversion section 11R, to the floating diffusion FD2; the transfer transistor Tr2 is configured by, for example, a MOS transistor.

The amplifier transistor AMP is a modulation element that modulates a charge amount generated in the organic photoelectric conversion section 11G into a voltage, and is configured by, for example, a MOS transistor.

The reset transistor RST resets charges transferred from the organic photoelectric conversion section 11G to the floating diffusion FD3, and is configured by, for example, a MOS transistor.

A lower first contact 75, a lower second contact 76, and an upper contact 13B are each configured by a doped silicon material such as PDAS (Phosphorus Doped Amorphous Silicon), or a metal material such as aluminum (Al), tungsten (W), titanium (Ti), cobalt (Co), hafnium (Hf), or tantalum (Ta), for example.

The organic photoelectric conversion section 11G is provided on the side of the first surface 11S1 of the semiconductor substrate 11. The organic photoelectric conversion section 11G has a configuration in which, for example, the lower electrode 15, the photoelectric conversion layer 16, and the upper electrode 17 are stacked in this order from the side of the first surface S1 of the semiconductor substrate 11. The lower electrode 15 is formed separately for each unit pixel P, for example. The photoelectric conversion layer 16 and the upper electrode 17 are provided as successive layers common to a plurality of unit pixels P (e.g., a pixel section 1a of the imaging device 1 illustrated in FIG. 5). The organic photoelectric conversion section 11G is an organic photoelectric conversion element that absorbs green light corresponding to a portion or all of a selective wavelength band (e.g., ranging from 450 nm to 650 nm) and generates electron-hole pairs.

Interlayer insulating layers 12 and 14 are stacked in this order, for example, from side of the semiconductor substrate 11 between the first surface 11S1 of the semiconductor substrate 11 and the lower electrode 15. The interlayer insulating layer has a configuration in which, for example, a layer having a fixed charge (fixed charge layer) 12A and a dielectric layer 12B having an insulating property are stacked. A protective layer 18 is provided on the upper electrode 17. An on-chip lens layer 19, which configures an on-chip lens 19L and serves also as a planarization layer, is disposed above the protective layer 18.

A through electrode 63 is provided between the first surface 11S1 and the second surface 11S2 of the semiconductor substrate 11. The organic photoelectric conversion section 11G is coupled to a gate Gamp of the amplifier transistor AMP and the floating diffusion FD3 via the through electrode 63. This makes it possible for the photoelectric conversion element 10 to favorably transfer charges generated in the organic photoelectric conversion section 11G on the side of the first surface 11S1 of the semiconductor substrate 11 to the side of the second surface 11S2 of the semiconductor substrate 11 via the through electrode 63, and thus to enhance the characteristics.

The through electrode 63 is provided, for example, for each organic photoelectric conversion section 11G of the photoelectric conversion element 10. The through electrode 63 functions as a connector between the organic photoelectric conversion section 11G and the gate Gamp of the amplifier transistor AMP as well as the floating diffusion FD3, and serves as a transmission path for charges generated in the organic photoelectric conversion section 11G.

The lower end of the through electrode 63 is coupled to, for example, a coupling section 71A in the wiring layer 71, and the coupling section 71A and the gate Gamp of the amplifier transistor AMP are coupled to each other via the lower first contact 75. The coupling section 71A and the floating diffusion FD3 are coupled to the lower electrode 15 via the lower second contact 76. It is to be noted that, in FIG. 1, the through electrode 63 is illustrated to have a cylindrical shape, but this is not limitative; the through electrode 63 may have a tapered shape, for example.

As illustrated in FIG. 1, a reset gate Grst of the reset transistor RST is preferably disposed next to the floating diffusion FD3. This makes it possible to reset charges accumulated in the floating diffusion FD3 by the reset transistor RST.

In the photoelectric conversion element 10 of the present embodiment, light incident on the organic photoelectric conversion section 11G from side of the upper electrode 17 is absorbed by the photoelectric conversion layer 16. Excitons thus generated move to an interface between an electron donor and an electron acceptor that constitute the photoelectric conversion layer 16, and undergo exciton separation, i.e., dissociate into electrons and holes. The charges (electrons and holes) generated here are transported to different electrodes by diffusion due to a difference in carrier concentrations or by an internal electric field due to a difference in work functions between an anode (here, the lower electrode 15) and a cathode (here, the upper electrode 17), and are detected as a photocurrent. In addition, application of an electric potential between the lower electrode 15 and the upper electrode 17 makes it possible to control directions in which electrons and holes are transported.

In the following, description is given of configurations, materials, and the like of the respective sections.

The organic photoelectric conversion section 11G is an organic photoelectric conversion element that absorbs light corresponding to a portion or all of a selective wavelength band (e.g., ranging from 450 nm to 750 nm) and generates electron-hole pairs. As described above, the organic photoelectric conversion section 11G is configured by, for example, the lower electrode 15 and the upper electrode 17 that are disposed to be opposed to each other, and the photoelectric conversion layer 16 provided between the lower electrode 15 and the upper electrode 17.

The lower electrode 15 is provided in a region opposed to and covering light receiving surfaces of the inorganic photoelectric conversion sections 11B and 11R formed in the semiconductor substrate 11. The lower electrode 15 is configured by a metal oxide having light transmissivity. Examples of a metal atom that configures the metal oxide used as a material of the lower electrode 15 include tin (Sn), zinc (Zn), indium (In), silicon (S1), zirconium (Zr), aluminum (Al), gallium (Ga), tungsten (W), chromium (Cr), cobalt (Co), nickel (Ni), tantalum (Ta), niobium (Nb), and molybdenum (Mo). Examples of the metal oxide containing one or more of the above metal atoms include ITO (indium tin oxide). However, in addition to the ITO, a dopant-doped tin oxide ($SnO_2$)-based material or a zinc oxide-based material in which zinc oxide is doped with a dopant may be used as a constituent material of the lower electrode 15. Examples of the zinc oxide-based material include aluminum zinc oxide (AZO) doped with aluminum (Al) as a dopant, gallium (Ga)-doped gallium zinc oxide (GZO), and indium (In)-doped indium zinc oxide (IZO). Aside from those mentioned above, CuI, $InSbO_4$, ZnMgO, $CuInO_2$, $MgIn_2O_4$, CdO, $ZnSnO_3$, or the like may be used.

Figure 2:
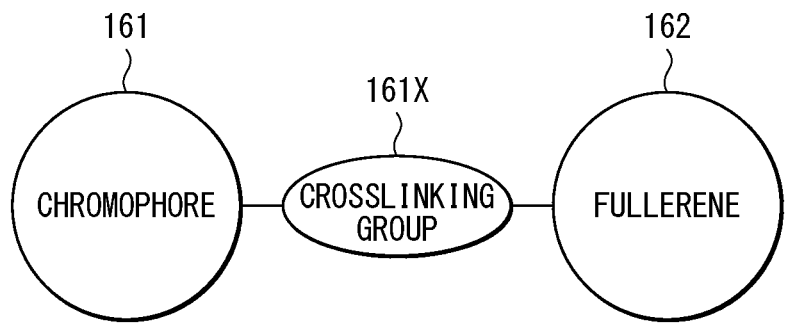
FIG. 2 is a schematic view of an example of structures of a chromophore and fullerene or a derivative thereof in a photoelectric conversion layer.

The photoelectric conversion layer 16 converts optical energy into electric energy, and includes, for example, two or more types of organic materials. Specifically, the photoelectric conversion layer 16 includes, for example, a chromophore, fullerene or a derivative thereof, and a hole-transporting material. As illustrated in FIG. 2, for example, a chromophore 161 and fullerene 162 (or a derivative thereof) of the above-mentioned three types of organic materials are dispersed at least partially in the photoelectric conversion layer 16 in a state of being bonded to each other via a crosslinking group. It is to be noted that, in the present embodiment, fullerene is treated as an organic material.

The chromophore 161 is an organic molecule having absorption in a visible-light region, and includes, for example, a color material having an absorption coefficient of 50000 $cm^1$ or more at a selective wavelength (e.g., green light ranging from 500 nm to 600 nm) of the visible-light region. This makes it possible for the organic photoelectric conversion section 11G to selectively perform photoelectric conversion of green light ranging from 500 nm to 600 nm, for example. The chromophore 161 has, for example, a structure in which conjugated systems are linked together in a chain or cyclic manner; for example, the chromophore 161 has a molecular structure in which, for example, two or more of five-membered rings or six-membered rings are linked together. In addition, the chromophore 161 is an organic material with a crosslinking group 161X in a molecule and has a small change, specifically within ±10 nm, in an absorption peak wavelength before and after bonding to the fullerene 162 (or a derivative thereof) via the crosslinking group 161X, although the detail thereof is described later.

Examples of such an organic material include subphthalocyanine, porphyrin, phthalocyanine, dipyrromethane, azadipyrromethane, dipyridyl, azadipyridyl, coumarin, perylene, perylene diimide, pyrene, naphthalene diimide, quinacridone, xanthene, xanthenoxanthene, phenoxazine, indigo, azooxazine, benzodithiophene, naphthodithiophene, anthradithiophene, rubicene, anthracene, tetracene, pentacene, anthraquinone, tetraquinone, pentaquinone, dinaphthothienothiophene, diketopyrrolopyrrole, oligothiophene, cyanine, squalium, and croconium, or a derivative thereof, as represented by the following formulae (1-1) to (1-40).

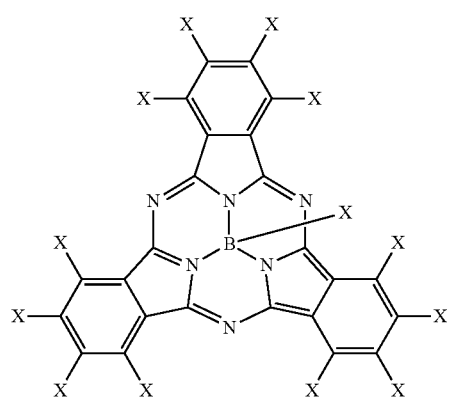 (1-1)
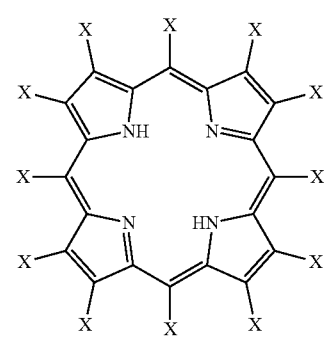 (1-2)
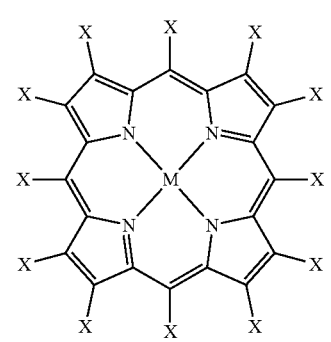 (1-3)
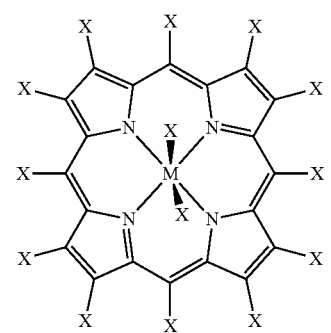 (1-4)
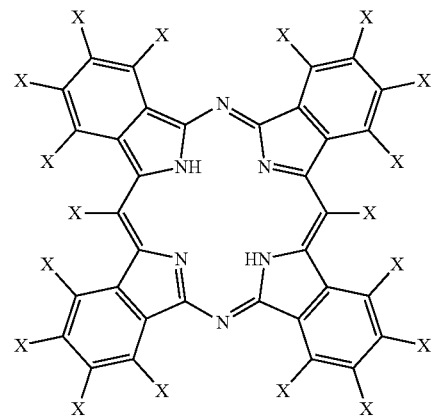 (1-5)
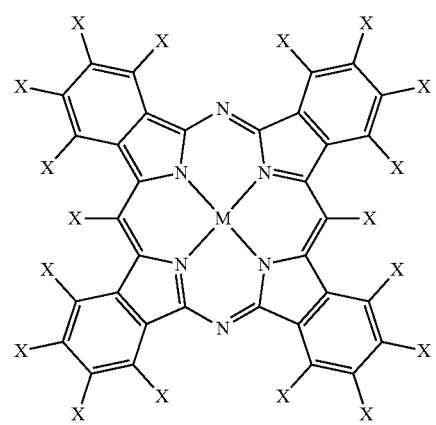 (1-6)
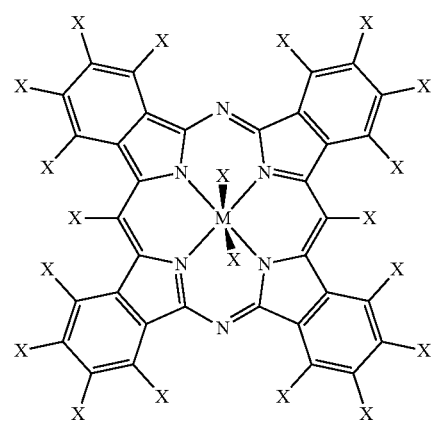 (1-7)
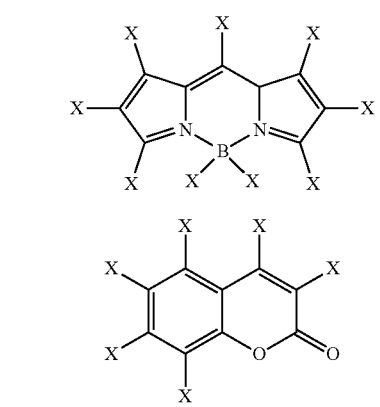 (1-8)
(1-9)

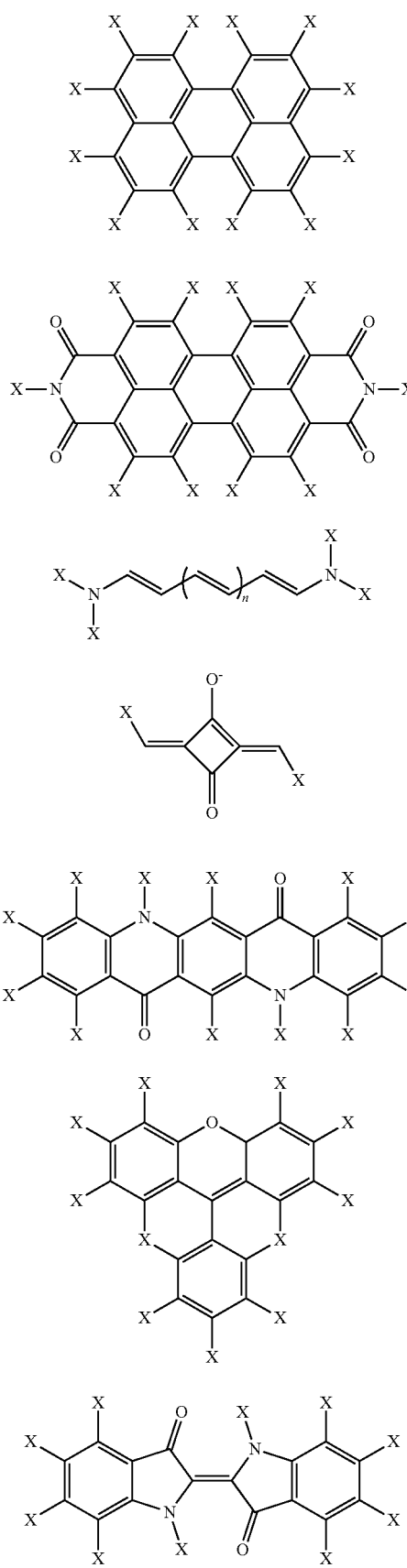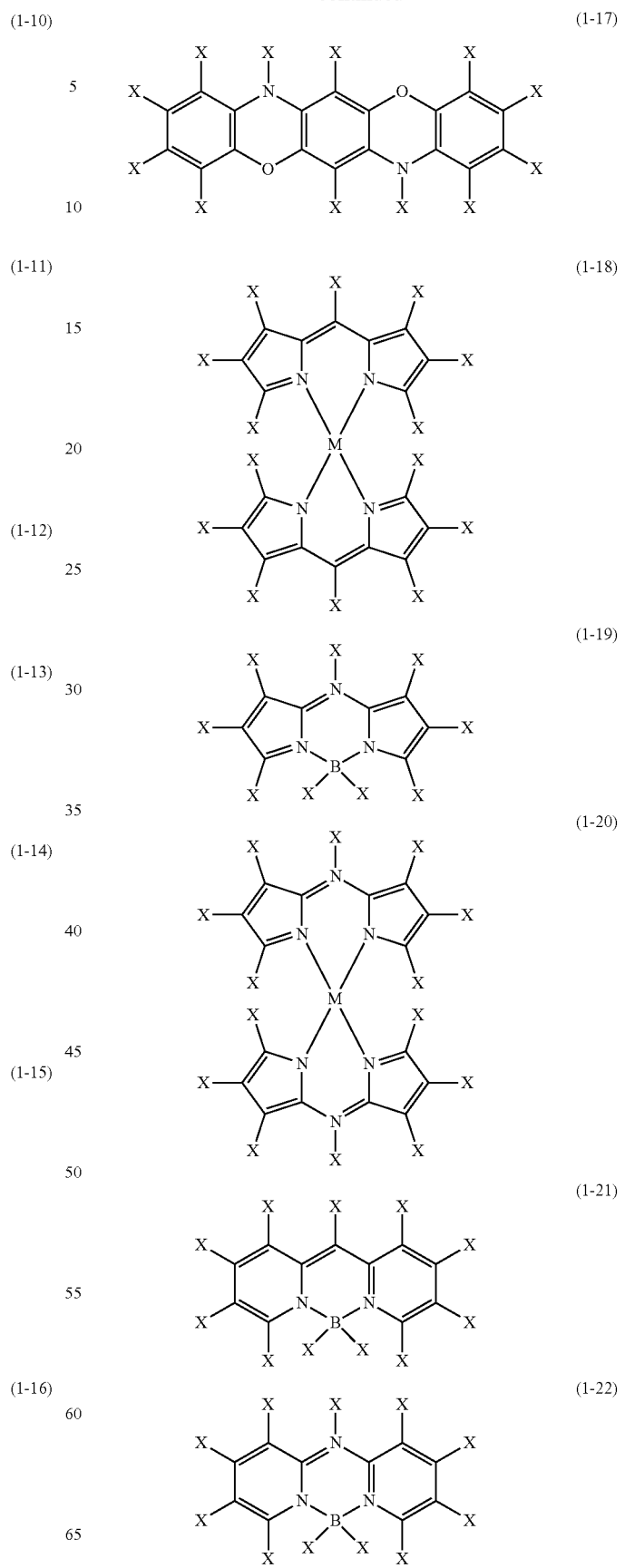

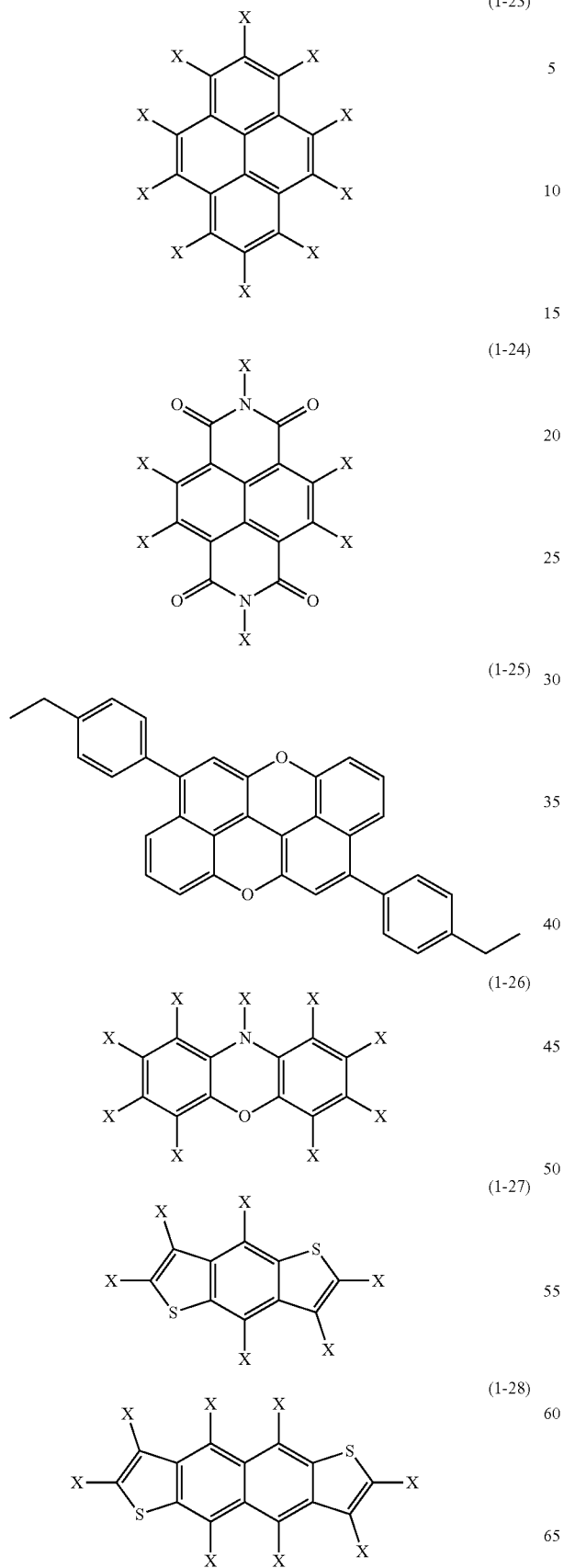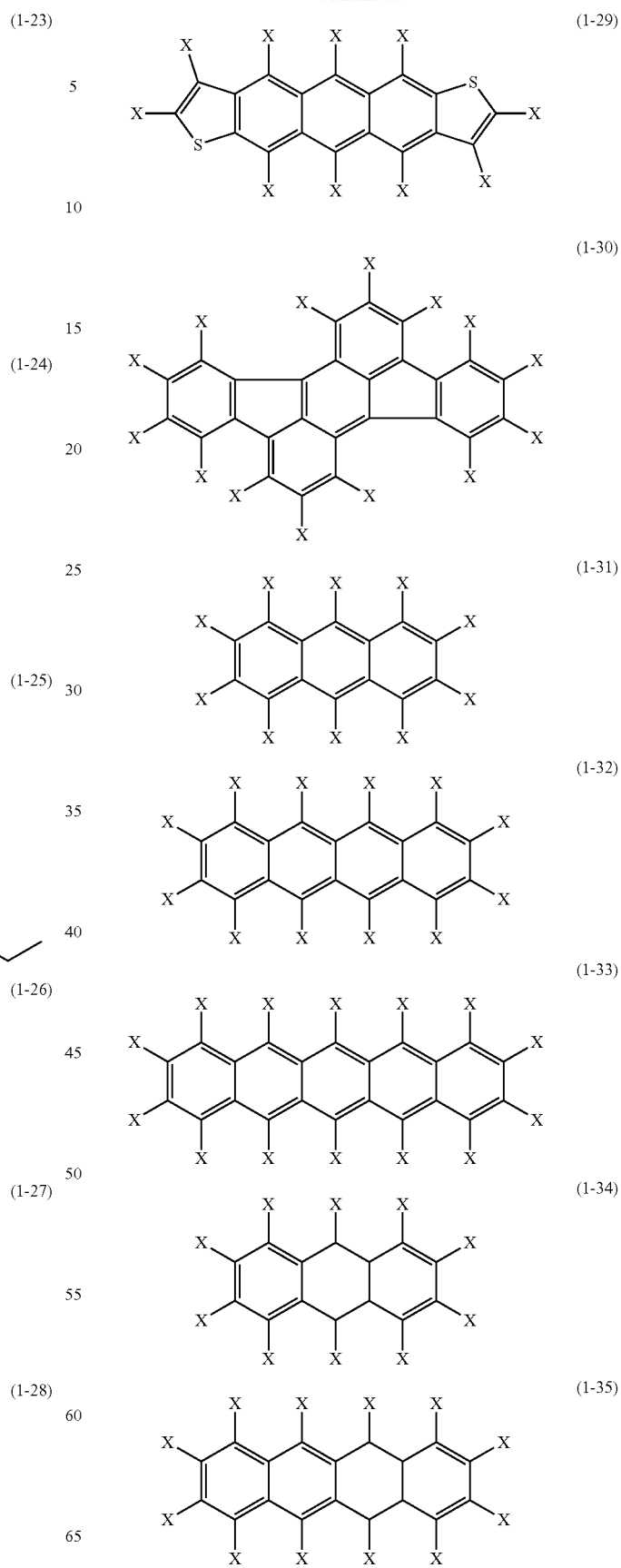

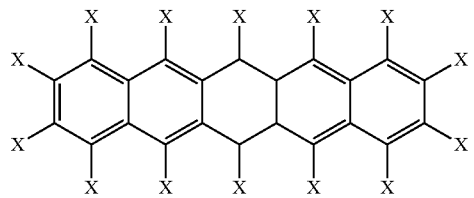 (1-36)

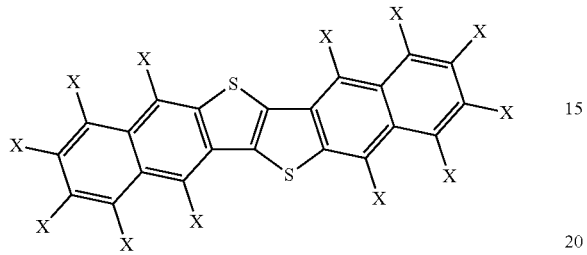 (1-37)

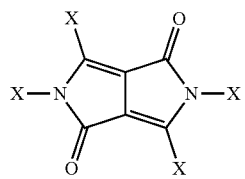 (1-38)

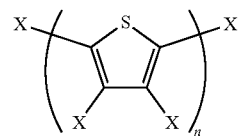 (1-39)

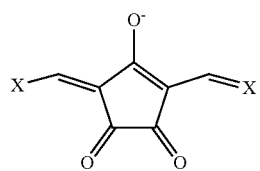 (1-40)

X in the above formulae (1-1) to (1-40) is a position at which the crosslinking group 161X is able to be introduced, and the crosslinking group 161X bondable to fullerene or a derivative thereof is introduced at any one or two of the positions. In addition, in each of the organic materials represented by the above formulae (1-1) to (1-40), the Xs may form a ring, and the crosslinking groups 161X may be provided to interpose the ring. M is a metal atom. n is an integer ranging from one to eight.

The crosslinking group 161X includes a conjugated diene; examples thereof include benzene, naphthalene, anthracene, tetracene, pentacene, cyclopentadiene, indene, furan, thiophene, benzofuran, benzothiophene, and 1,3-butadiene, as represented by the following formulae (X-1) to (X-24). The type and position of chemical bond between the chromophore 161 and the crosslinking group 161X are not particularly limited. Aside from the above, for example, a linear alkyl group, a branched alkyl group, a cycloalkyl group, an alkenyl group, an alkynyl group, an ether bond, a thioether bond, an amino group, an acyl group, an ester bond, an amide bond, a phenyl group, a naphthyl group, a biphenyl group, a terphenyl group, a thienyl group, a bithienyl group, a thienyl phenyl group, a furyl group, a pyrrole group, a benzothienyl group, a benzofuran group, an indole group, and an indene group may be used therebetween.

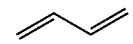 (X-1)

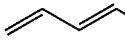 (X-2)

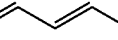 (X-3)

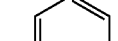 (X-4)

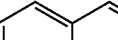 (X-5)

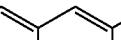 (X-6)

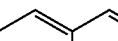 (X-7)

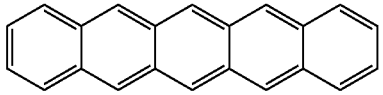 (X-8)

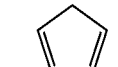 (X-9)

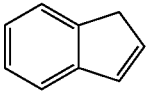 (X-10)

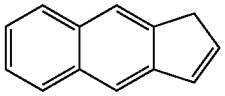 (X-11)

 (X-12)

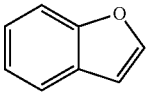 (X-13)

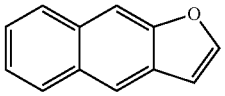 (X-14)

 (X-15)

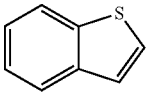 (X-16)

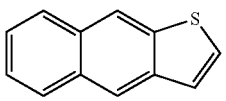
(X-17)

(X-18)

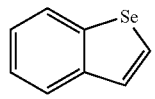
(X-19)

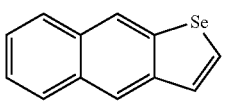
(X-20)

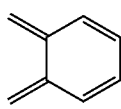
(X-21)

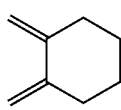
(X-22)

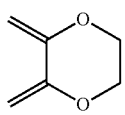
(X-23)

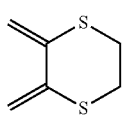
(X-24)

Aside from the crosslinking group 161X, those introduced into the X may be, each independently, a hydrogen atom, a halogen atom, a linear, branched, or cyclic alkyl group, a thioalkyl group, a thioaryl group, an arylsulfonyl group, an alkylsulfonyl group, an amino group, an alkylamino group, an arylamino group, a hydroxy group, an alkoxy group, an acylamino group, an acyloxy group, a phenyl group, a carboxy group, a carboxoamido group, a carboalkoxy group, an acyl group, a sulfonyl group, a cyano group, and a nitro group, or a derivative thereof. In addition, as described above, any adjacent Xs may be a portion of a fused aliphatic ring or a fused aromatic ring. The fused aliphatic ring or the fused aromatic ring may contain one or a plurality of atoms other than carbon.

The fullerene 162 or a derivative thereof functions, for example, as an electron-transporting material in the photoelectric conversion layer 16. Examples of the fullerene or the derivative thereof include $C_{60}$ fullerene represented by the following formula (2-1) and $C_{70}$ fullerene represented by the following formula (2-2).

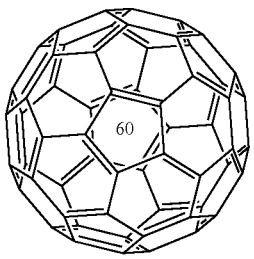

(2-1)

(2-2)

Figure 3:
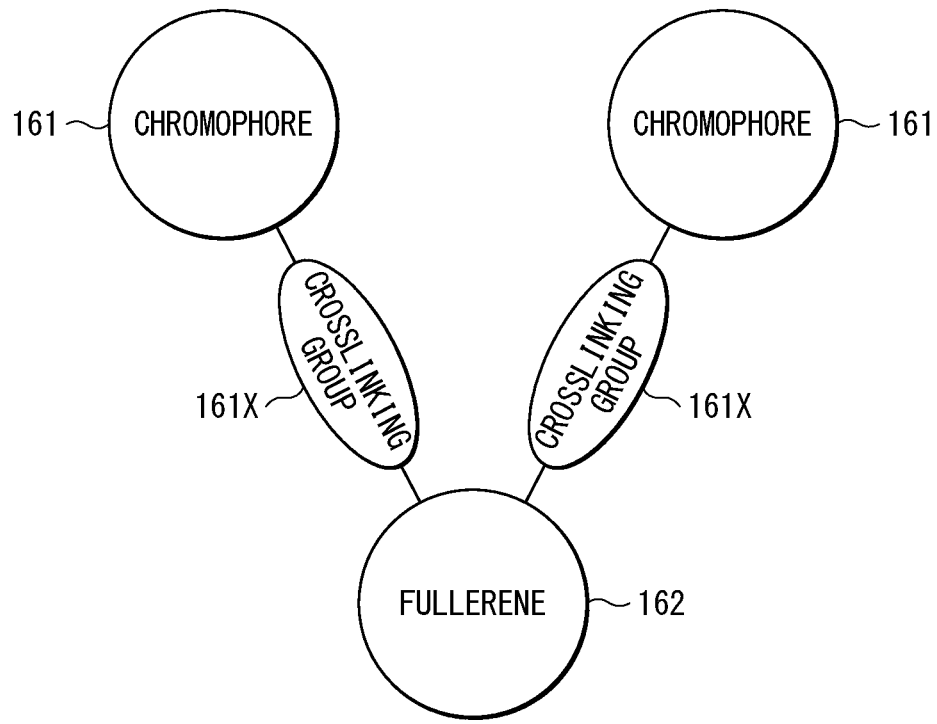
FIG. 3 is a schematic view of another example of the structures of the chromophore and the fullerene or the derivative thereof in the photoelectric conversion layer.

It is to be noted that, FIG. 2 illustrates an example in which the chromophore 161 and the fullerene 162 are bonded together at 1:1 with the crosslinking group 161X interposed therebetween; however, this is not limitative. For example, as illustrated in FIG. 3, two or more molecules of the chromophore 161 may be each bonded to one molecule of the fullerene 162 or the derivative thereof via the crosslinking group 161X. Alternatively, a plurality of the fullerenes 162 or derivatives thereof may be each bonded to one molecule of the chromophore 161 via the crosslinking group 161X.

Aside from the above, the photoelectric conversion layer 16 preferably includes one or more types of organic materials having a hole-transporting property. The organic material having a hole-transporting property preferably has a HOMO (Highest Occupied Molecular Orbital) level higher than that of the fullerene 162 or the derivative thereof. Examples of the organic material having a hole-transporting property include compounds represented by the following formulae (3-1) to (3-11). Aside from the above, examples of the hole-transporting material include a triarylamine derivative (TPD, NPB, TAPC, etc.), a carbazole derivative (CBP, TCTA, etc.), and a fluorene derivative (BSBF, etc.).

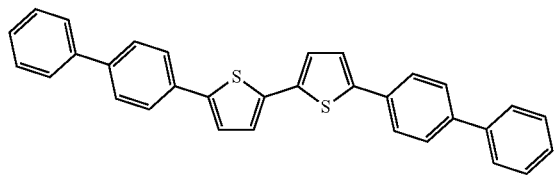
(3-1)
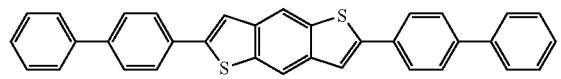
(3-2)
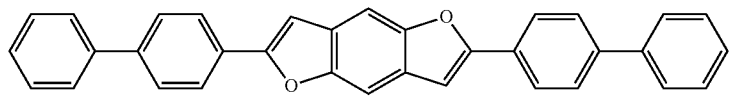
(3-3)
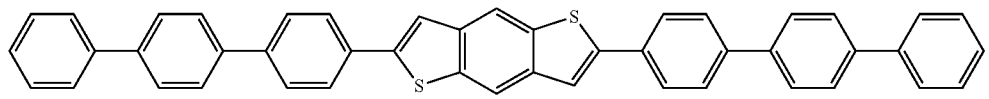
(3-4)
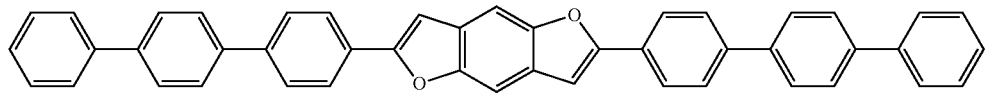
(3-5)
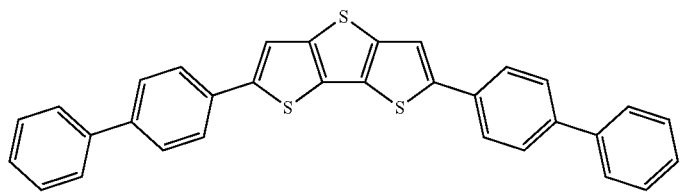
(3-6)
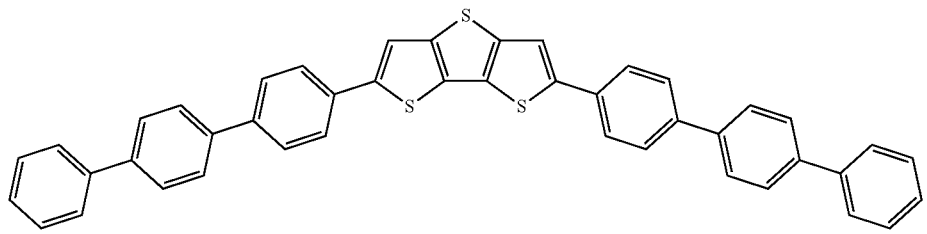
(3-7)
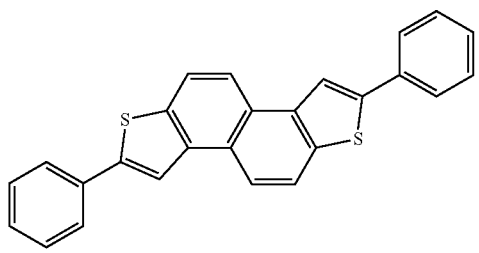
(3-8)
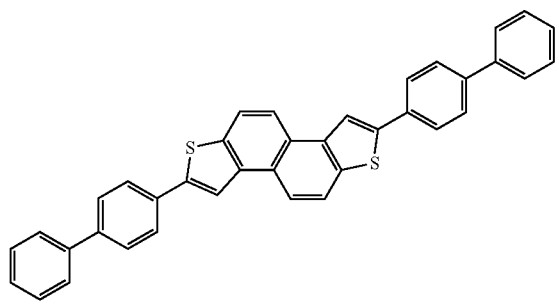
(3-9)

-continued

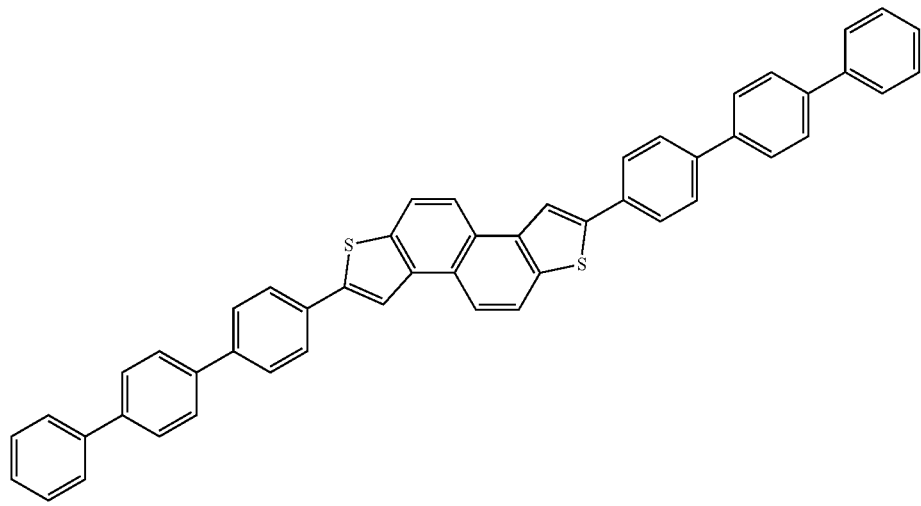
(3-110)

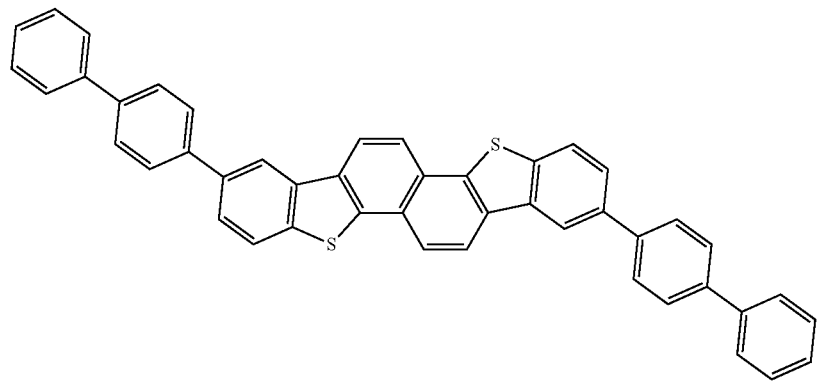
(3-11)

The photoelectric conversion layer 16 includes a junction surface (p/n junction surface) between the p-type semiconductor and the n-type semiconductor inside the layer. The p-type semiconductor functions relatively as an electron donor (donor), and the n-type semiconductor functions relatively as an electron acceptor (acceptor). The photoelectric conversion layer 16 provides a field in which excitons generated at the time of light absorption are separated into electrons and holes, and excitons are separated into electrons and holes at the interface (p/n junction surface) between the electron donor and the electron acceptor. The photoelectric conversion layer 16 has a thickness of, for example, 50 nm to 500 nm.

The upper electrode 17 is configured by an electrically-conductive film having light transmissivity similar to that of the lower electrode 15. In the photoelectric conversion element 10, the upper electrode 17 may be separated for each unit pixel P, or may be formed as a common electrode for each unit pixel P. The upper electrode 17 has a thickness of, for example, 10 nm to 200 nm.

It is to be noted that other layers may be provided between the photoelectric conversion layer 16 and the lower electrode 15 and between the photoelectric conversion layer 16 and the upper electrode 17. Specifically, for example, an underlying layer, a hole transport layer, an electron block layer, the photoelectric conversion layer 16, a hole block layer, a buffer layer, an electron transport layer, a work function adjusting layer, and the like may be stacked in order from side of the lower electrode 15.

The fixed charge layer 12A may be a film having a positive fixed charge or a film having a negative fixed charge. Examples of a material of the film having a negative fixed charge include hafnium oxide ($HfO_2$), aluminum oxide ($Al_2O_3$), zirconium oxide ($ZrO_2$), tantalum oxide ($Ta_2O_5$), and titanium oxide ($TiO_2$). In addition, as a material other than those mentioned above, there may be used lanthanum oxide, praseodymium oxide, cerium oxide, neodymium oxide, promethium oxide, samarium oxide, europium oxide, gadolinium oxide, terbium oxide, dysprosium oxide, holmium oxide, thulium oxide, ytterbium oxide, lutetium oxide, yttrium oxide, an aluminum nitride film, a hafnium oxynitride film, an aluminum oxynitride film, or the like.

The fixed charge layer 12A may have a configuration in which two or more types of films are stacked. This makes it possible to further enhance a function as the hole accumulation layer, for example, in a case of the film having a negative fixed charge.

A material of the dielectric layer 12B is not particularly limited, and the dielectric layer 12B is formed by, for example, a silicon oxide film, a TEOS film, a silicon nitride film, a silicon oxynitride film, or the like.

An interlayer insulating layer 14 is configured by a monolayer film of one of silicon oxide (SiO), silicon nitride (SiN), silicon oxynitride (SiON), and the like, for example, or alternatively is configured by a stacked film of two or more thereof.

The protective layer 18 is configured by a material having light transmissivity, and is configured by a monolayer film of one of silicon oxide, silicon nitride, silicon oxynitride, and the like, for example, or alternatively is configured by a stacked film of two or more thereof. The protective layer 18 has a thickness of, for example, 100 nm to 30000 nm.

The on-chip lens layer 19 is formed on the protective layer 18 to cover the entire surface thereof. A plurality of on-chip lenses 19L (microlenses) is provided on the front surface of the on-chip lens layer 19. The on-chip lens 19L condenses light incident from above on each light receiving surface of the organic photoelectric conversion section 11G and the inorganic photoelectric conversion sections 11B and 11R. In the present embodiment, the multilayer wiring line 70 is formed on the side of the second surface 11S2 of the semiconductor substrate 11, which enables the light receiving surfaces of the organic photoelectric conversion section 11G and the inorganic photoelectric conversion sections 11B and 11R to be arranged close to each other, thus making it possible to reduce variations in sensitivities between colors generated depending on a F-value of the on-chip lens 19L.

Figure 4:
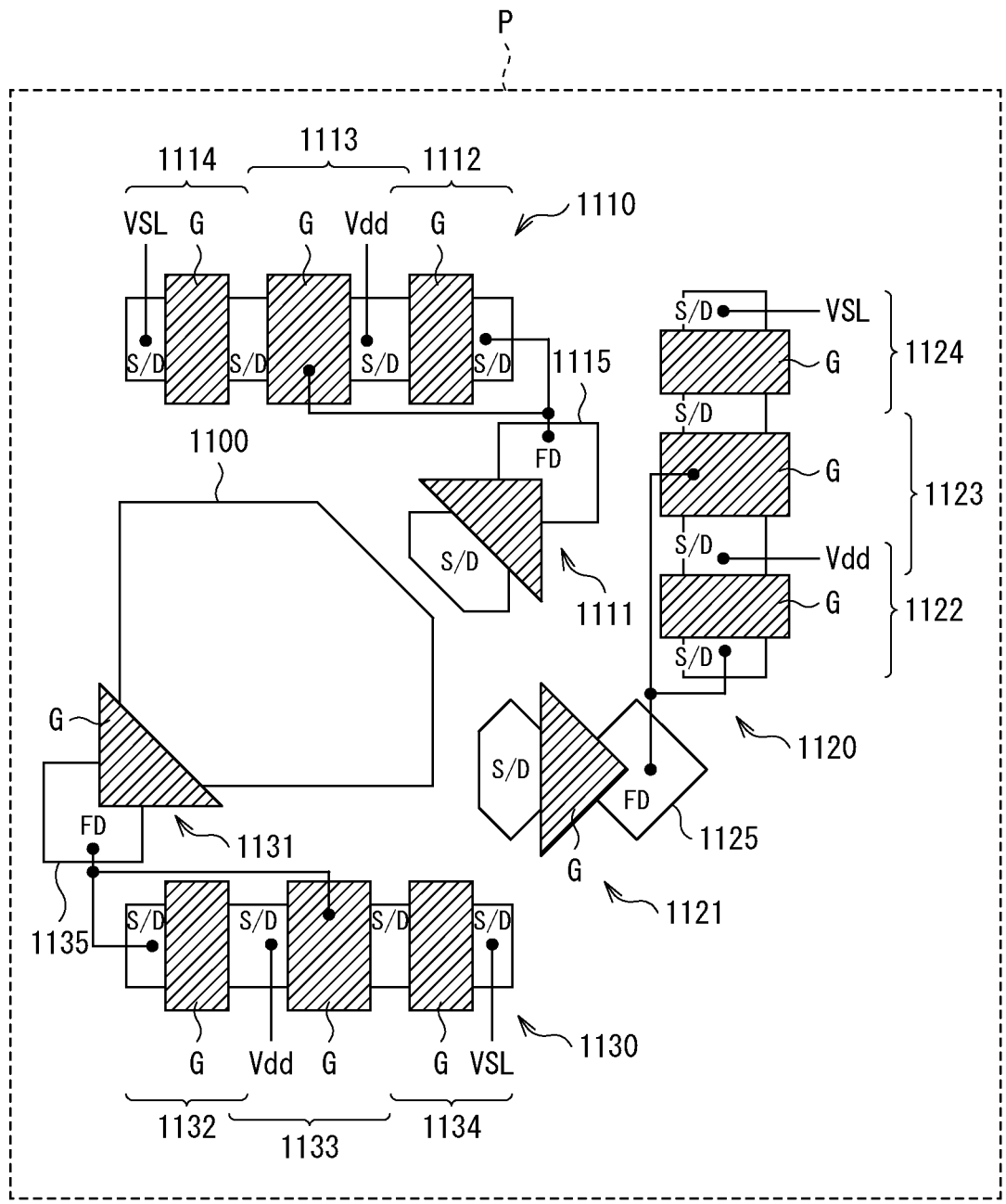
FIG. 4 is a schematic plan view of a configuration of a unit pixel of the photoelectric conversion element illustrated in FIG. 1.

FIG. 4 is a plan view of a configuration example of the photoelectric conversion element 10 in which a plurality of photoelectric conversion sections, to which the technology according to the present disclosure is applicable, (e.g., the above-described inorganic photoelectric conversion sections 11B and 11R and organic photoelectric conversion section 11G) are stacked. That is, FIG. 4 illustrates an example of a planar configuration of the unit pixel P constituting a pixel section 1a illustrated in FIG. 7, for example.

The unit pixel P includes a photoelectric conversion region 1100 in which a red photoelectric conversion section (the inorganic photoelectric conversion section 11R in FIG. 1), a blue photoelectric conversion section (the inorganic photoelectric conversion section 11B in FIG. 1), and a green photoelectric conversion section (the organic photoelectric conversion section 11G in FIG. 1) (neither of which is illustrated in FIG. 4) that perform photoelectric conversion of light of respective wavelengths of R (Red), G (Green), and B (Blue) are stacked in three layers in the order of the green photoelectric conversion section, the blue photoelectric conversion section, and the red photoelectric conversion section, for example, from side of the light receiving surface (the light incident surface S1 in FIG. 1). Further, the unit pixel P includes a Tr group 1110, a Tr group 1120, and a Tr group 1130 as charge readout sections that read charges corresponding to light of respective wavelengths of R, G, and B from the red photoelectric conversion section, the green photoelectric conversion section, and the blue photoelectric conversion section. The imaging device 1 performs, in one unit pixel P, spectroscopy in the vertical direction, i.e., spectroscopy of light of R, G, and B in respective layers as the red photoelectric conversion section, the green photoelectric conversion section, and the blue photoelectric conversion section stacked in the photoelectric conversion region 1100.

The Tr group 1110, the Tr group 1120, and the Tr group 1130 are formed on the periphery of the photoelectric conversion region 1100. The Tr group 1110 outputs, as a pixel signal, a signal charge corresponding to light of R generated and accumulated in the red photoelectric conversion section. The Tr group 1110 is configured by a transfer Tr (MOS FET) 1111, a reset Tr 1112, an amplification Tr 1113, and a selection Tr 1114. The Tr group 1120 outputs, as a pixel signal, a signal charge corresponding to light of B generated and accumulated in the blue photoelectric conversion section. The Tr group 1120 is configured by a transfer Tr 1121, a reset Tr 1122, an amplification Tr 1123, and a selection Tr 1124. The Tr group 1130 outputs, as a pixel signal, a signal charge corresponding to light of G generated and accumulated in the green photoelectric conversion section. The Tr group 1130 is configured by a transfer Tr 1131, a reset Tr 1132, an amplification Tr 1133, and a selection Tr 1134.

The transfer Tr 1111 is configured by (a source/drain region constituting) a gate G, a source/drain region S/D, and an FD (floating diffusion) 1115. The transfer Tr 1121 is configured by a gate G, a source/drain region S/D, and an FD 1125. The transfer Tr 1131 is configured by a gate G, (a source/drain region S/D coupled to) the green photoelectric conversion section of the photoelectric conversion region 1100, and an FD 1135. It is to be noted that the source/drain region of the transfer Tr 1111 is coupled to the red photoelectric conversion section of the photoelectric conversion region 1100, and that the source/drain region S/D of the transfer Tr 1121 is coupled to the blue photoelectric conversion section of the photoelectric conversion region 1100.

Each of the reset Trs 1112, 1132, and 1122, the amplification Trs 1113, 1133, and 1123, and the selection Trs 1114, 1134, and 1124 is configured by a gate G and a pair of source/drain regions S/D arranged to interpose the gate G therebetween.

The FDs 1115, 1135, and 1125 are coupled to the source/drain regions S/D serving as sources of the reset Trs 1112, 1132, and 1122, respectively, and are coupled to the gates G of the amplification Trs 1113, 1133 and 1123, respectively. A power supply Vdd is coupled to the common source/drain region S/D in each of the reset Tr 1112 and the amplification Tr 1113, the reset Tr 1132 and the amplification Tr 1133, and the reset Tr 1122 and the amplification Tr 1123. A VSL (vertical signal line) is coupled to each of the source/drain regions S/D serving as the sources of the selection Trs 1114, 1134, and 1124.

The technology according to the present disclosure is applicable to the above-described photoelectric conversion element.

(1-2. Method of Manufacturing Photoelectric Conversion Element)

The photoelectric conversion element 10 of the present embodiment may be manufactured, for example, as follows.

Figure 5:
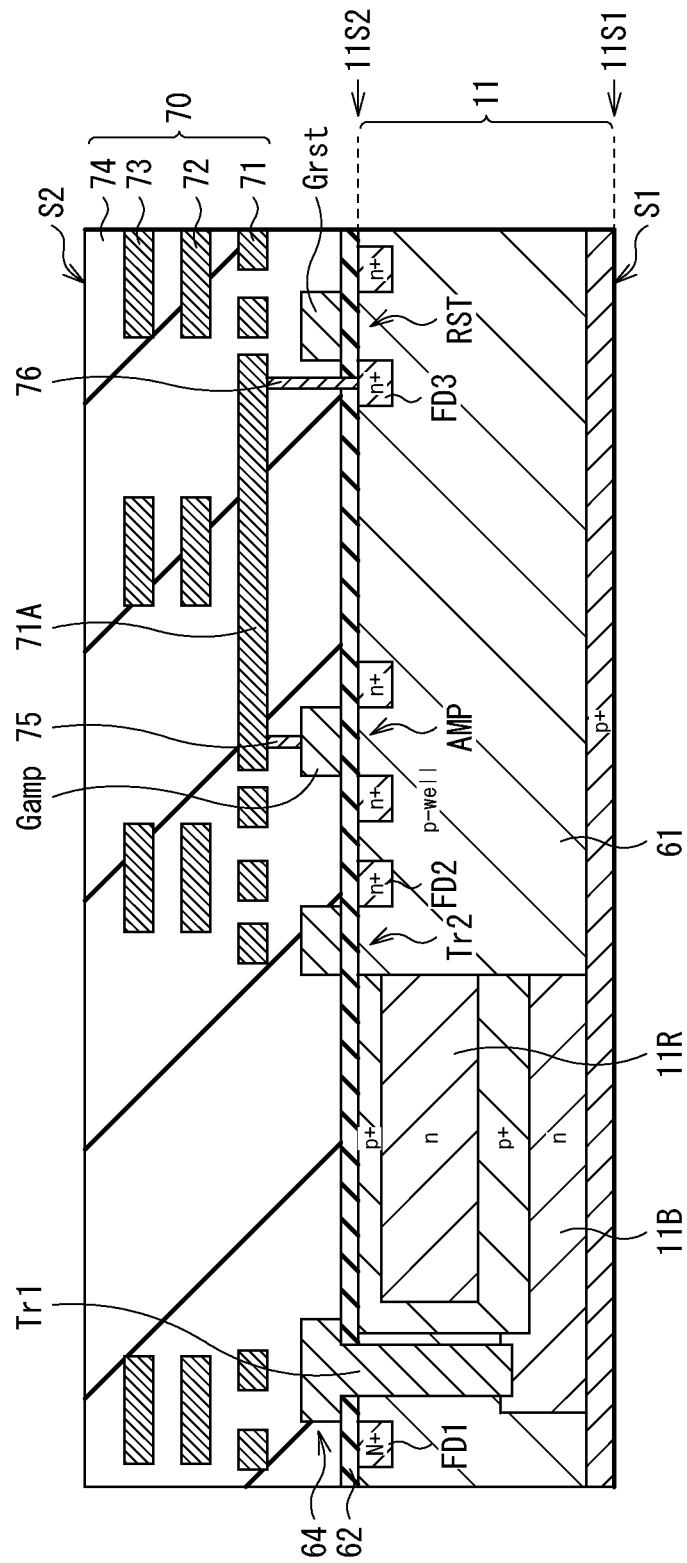
FIG. 5 is a schematic cross-sectional view for describing a method of manufacturing the photoelectric conversion element illustrated in FIG. 1.
Figure 6:
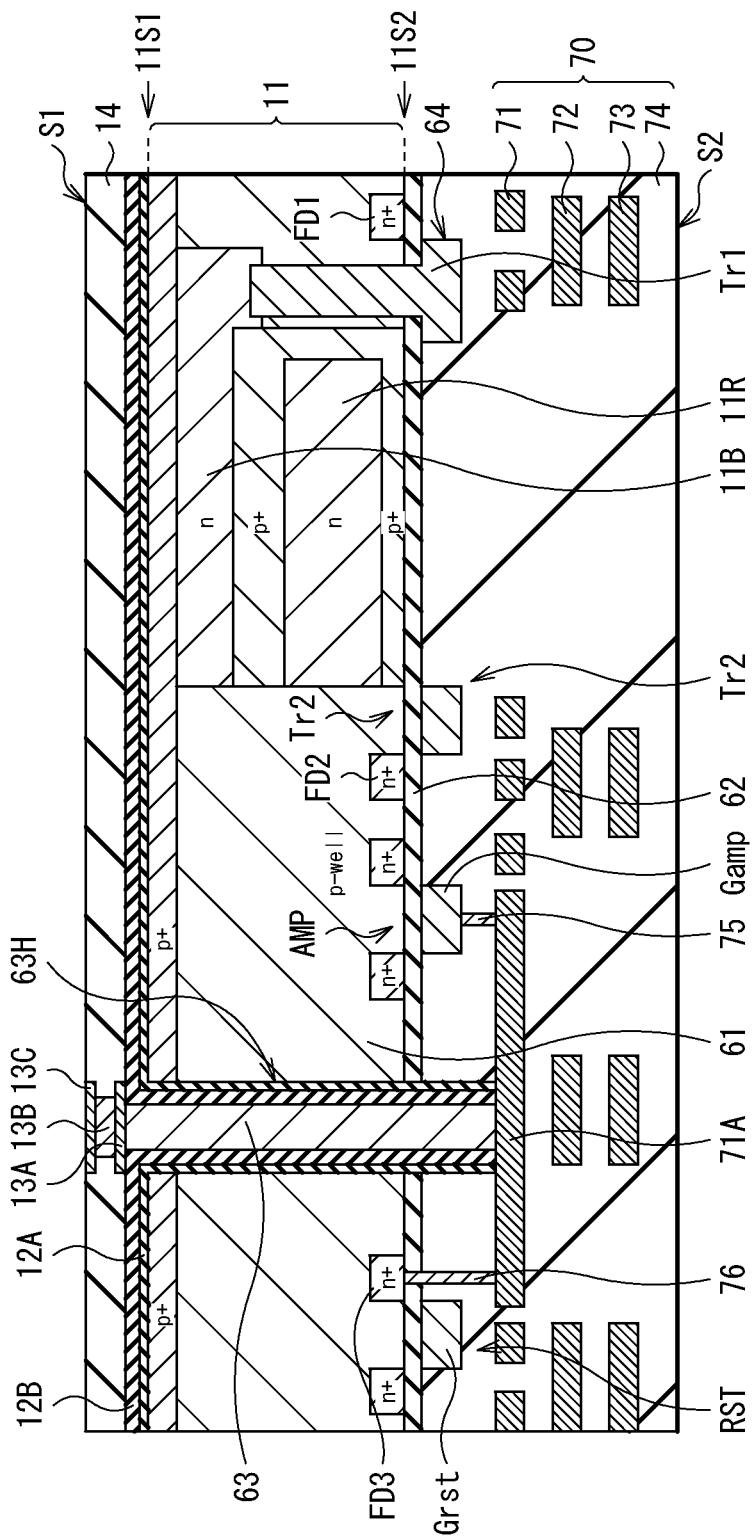
FIG. 6 is a schematic cross-sectional view of a step subsequent to FIG. 5.

FIGS. 5 and 6 illustrate the method of manufacturing the photoelectric conversion element 10 in the order of steps. First, as illustrated in FIG. 5, the p-well 61, for example, is formed as a well of a first electrically-conductivity type in the semiconductor substrate 11, and the inorganic photoelectric conversion sections 11B and 11R of a second electrically-conductivity type (e.g., n-type) is formed in the p-well 61. The p+ region is formed in the vicinity of the first surface 11S1 of the semiconductor substrate 11.

As illustrated in FIG. 5 as well, on the second surface 11S2 of the semiconductor substrate 11, n+ regions serving as the floating diffusions FD1 to FD3 are formed, and then, a gate insulating layer 62 and a gate wiring layer 64 including respective gates of the vertical transistor Tr1, the transfer transistor Tr2, the amplifier transistor AMP, and the reset transistor RST are formed. As a result, the vertical transistor Tr1, the transfer transistor Tr2, the amplifier transistor AMP, and the reset transistor RST are formed. Further, the multilayer wiring line 70 including the lower first contact 75, the lower second contact 76, the wiring layers 71 to 73 that include the coupling section 71A, and the insulating layer 74 is formed on the second surface 11S2 of the semiconductor substrate 11.

As a base of the semiconductor substrate 11, for example, an SOI (Silicon on Insulator) substrate is used, in which the semiconductor substrate 11, a buried oxide film (not illustrated), and a holding substrate (not illustrated) are stacked. Although not illustrated in FIG. 5, the buried oxide film and the holding substrate are joined to the first surface 11S1 of the semiconductor substrate 11. After ion implantation, anneal treatment is performed.

Next, a supporting substrate (not illustrated) or another semiconductor substrate, etc. is joined to the side of the second surface 11S2 (side of the multilayer wiring line 70) of the semiconductor substrate 11, and the substrate is turned upside down. Subsequently, the semiconductor substrate 11 is separated from the buried oxide film and the holding substrate of the SOI substrate to expose the first surface 11S1 of the semiconductor substrate 11. The above steps may be performed by techniques used in common CMOS processes, such as ion implantation and CVD (Chemical Vapor Deposition).

Next, as illustrated in FIG. 6, the semiconductor substrate 11 is processed from the side of the first surface 11S1 by dry-etching, for example, to form a ring-shaped opening 63H. As illustrated in FIG. 6, as for the depth, the opening 63H penetrates from the first surface 11S1 to the second surface 11S2 of the semiconductor substrate 11, and reaches, for example, the coupling section 71A.

Subsequently, as illustrated in FIG. 6 for example, the negative fixed charge layer 12A is formed on the first surface 11S1 of the semiconductor substrate 11 and a side surface of the opening 63H. Two or more types of films may be stacked as the negative fixed charge layer 12A. This makes it possible to further enhance the function as the hole accumulation layer. After the negative fixed charge layer 12A is formed, the dielectric layer 12B is formed.

Next, an electric conductor is buried in the opening 63H to form the through electrode 63. It is possible to use, as the electric conductor, for example, a metal material such as aluminum (Al), tungsten (W), titanium (Ti), cobalt (Co), hafnium (Hf), and tantalum (Ta), in addition to a doped silicon material such as PDAS (Phosphorus Doped Amorphous Silicon).

Subsequently, after formation of a pad section 13A on the through electrode 63, there is formed, on the dielectric layer 12B and the pad section 13A, the interlayer insulating layer 14 in which the upper contact 13B and a pad section 13C that electrically couple the lower electrode 15 and the through electrode 63 (specifically, the pad section 13A on the through electrode 63) are provided on the pad section 13A.

Next, the lower electrode 15, the photoelectric conversion layer 16, the upper electrode 17, and the protective layer 18 are formed in this order on the interlayer insulating layer 14. The photoelectric conversion layer 16 is formed, as a film, by, for example, the above-described chromophore 161, the fullerene 162 (or a derivative thereof), and the hole-transporting material by means of, for example, a vacuum vapor deposition method. The chromophore 161 and the fullerene 162 (or a derivative thereof) are bonded together at least partially via a crosslinking group by heat or light irradiation upon film formation or by heating or light irradiation after the film formation. Finally, the on-chip lens layer 19 is disposed, which includes the plurality of on-chip lenses 19L on the surface thereof. Thus, the photoelectric conversion element 10 illustrated in FIG. 1 is completed.

It is to be noted that, when forming another organic layer (e.g., an electron-blocking layer, etc.) on or under the photoelectric conversion layer 16 as described above, it is desirable to continuously form the other organic layer (by a vacuum-consistent process) in a vacuum process. In addition, the method of forming the photoelectric conversion layer 16 is not necessarily limited to the method using a vacuum vapor deposition method; another method, for example, a spin-coating technique, a printing technique, or the like may be used.

In the photoelectric conversion element 10, when light enters the organic photoelectric conversion section 11G through the on-chip lens 19L, the light passes through the organic photoelectric conversion section 11G and the inorganic photoelectric conversion sections 11B and the 11R in this order, and photoelectrically converted for each light of green, blue, and red in the passing process. Hereinafter, description is given of a signal acquisition operation of each color.

(Acquisition of Green Signal by Organic Photoelectric Conversion Section 11G)

Green light of the light having entered the photoelectric conversion element 10 is first selectively detected (absorbed) by the organic photoelectric conversion section 11G and is subjected to photoelectric conversion.

The organic photoelectric conversion section 11G is coupled to the gate Gamp of the amplifier transistor AMP and the floating diffusion FD3 via the through electrode 63. Accordingly, holes of the electron-hole pairs generated in the organic photoelectric conversion section 11G are extracted from the side of the lower electrode 15, transferred to the side of the second surface 11S2 of the semiconductor substrate 11 via the through electrode 63, and accumulated in the floating diffusion FD3. At the same time, a charge amount generated in the organic photoelectric conversion section 11G is modulated into a voltage by the amplifier transistor AMP.

In addition, the reset gate Grst of the reset transistor RST is disposed next to the floating diffusion FD3. As a result, the charges accumulated in the floating diffusion FD3 are reset by the reset transistor RST.

Here, the organic photoelectric conversion section 11G is coupled not only to the amplifier transistor AMP but also to the floating diffusion FD3 via the through electrode 63, thus making it possible to easily reset the charges accumulated in the floating diffusion FD3 by the reset transistor RST.

On the other hand, in a case where the through electrode 63 and the floating diffusion FD3 are not coupled to each other, it is difficult to reset the charges accumulated in the floating diffusion FD3, thus resulting in application of a large voltage to pull out the charges to the side of the upper electrode 17. Accordingly, there is a possibility that the photoelectric conversion layer 16 may be damaged. In addition, the structure that enables resetting in a short period of time leads to an increase in dark noises, resulting in a trade-off, which structure is thus difficult.

(Acquisition of Blue Signal and Red Signal by Inorganic Photoelectric Conversion Sections 11B and 11R)

Subsequently, among the light transmitted through the organic photoelectric conversion section 11G, blue light and red light are sequentially absorbed by the inorganic photoelectric conversion section 11B and the inorganic photoelectric conversion section 11R, respectively, and are subjected to photoelectric conversion. In the inorganic photoelectric conversion section 11B, electrons corresponding to the incident blue light are accumulated in an n-region of the inorganic photoelectric conversion section 11B, and the accumulated electrons are transferred to the floating diffusion FD1 by the vertical transistor Tr1. Similarly, in the inorganic photoelectric conversion section 11R, electrons corresponding to the incident red light are accumulated in an n-region of the inorganic photoelectric conversion section 11R, and the accumulated electrons are transferred to the floating diffusion FD2 by the transfer transistor Tr2.

(1-3. Workings and Effects)

As described above, examples of the method of manufacturing an organic moiety of the organic photoelectric conversion element include a vacuum vapor deposition method and a coating method, when roughly divided. Among those, the vacuum vapor deposition method enables patterning to be easily performed using a metal mask. In addition, the vacuum vapor deposition method forms a film by vaporizing or sublimating v that is a vapor deposition material, and thus impurities derived from a solvent are not mixed thereinto. Further, it is unnecessary to dissolve an organic material in a solvent as in the coating method, thus bringing about an advantage of making it unnecessary to introduce a substituent soluble in the organic material.

Incidentally, a photoelectric conversion layer in which a dye and fullerene are combined has been considered on many occasions for the organic photoelectric conversion element; when presupposing that a photoelectric conversion layer is formed as a film by means of the vacuum vapor deposition method as the manufacturing method, the following issues are listed.

Firstly, introducing a substituent into fullerene enables control of an energy state, which enables an open voltage (Voc) to be enhanced; however, there is a possibility that the fullerene into which the substituent is introduced may decompose upon vacuum vapor deposition, thus causing an issue in which it is difficult to construct a stable manufacturing process.

Secondly, in order to obtain a high photoelectric conversion efficiency in an organic photoelectric conversion element using fullerene, the distance between a dye and fullerene and orientations thereof in a photoelectric conversion layer are important; as a method of controlling the distance and orientations, a method of directly bonding the dye and the fullerene together is conceivable. However, there is a possibility that a molecule directly bonding two skeletons together may decompose upon vacuum vapor deposition, similarly to the above-mentioned fullerene in which a substituent is introduced, thus causing an issue in which it is difficult to construct a stable manufacturing process.

There has been proposed, as a method for solving the above-mentioned issues, for example, a method of introducing a substituent into $C_{60}$ fullerene after vapor deposition by utilizing a Dields-Alder reaction. However, in the Dields-Alder reaction, a ring structure that serves to absorb visible light of a dye is opened, thus causing issues in which the absorption amount of visible light is reduced and a light collection efficiency is lowered.

Meanwhile, in the present embodiment, the photoelectric conversion layer 16 is formed, which includes a chromophore, fullerene or a derivative thereof, and a hole-transporting material, and in which a portion of the chromophore 161 and the fullerene 162 or the derivative thereof are bonded together via the crosslinking group 161X. This makes it possible to optimize an energy level of the fullerene or the derivative thereof, or optimize orientations of the chromophore and the fullerene or the derivative thereof, and thus to improve an electron transfer efficiency or an energy transfer efficiency between the chromophore and the fullerene or the derivative thereof. Further, it is possible to suppress generation of a trap at an interface.

As described above, in the photoelectric conversion element 10 and the manufacturing method thereof according to the present embodiment, the photoelectric conversion layer 16 is formed, which includes the chromophore 161 and the fullerene 162 or the derivative thereof, which are bonded to each other at least partially via the crosslinking group 161X, and the hole-transporting material. This allows for optimization of an energy level of the fullerene or the derivative thereof, or optimization of orientations of the chromophore and the fullerene or the derivative thereof. This therefore improves an electron transfer efficiency or an energy transfer efficiency between the chromophore and the fullerene or the derivative thereof, and suppresses generation of a trap at an interface. Thus, it is possible to achieve a photoelectric conversion element having superior photoelectric conversion characteristics and superior response characteristics.

Further, it is possible to form the photoelectric conversion layer 16, as a film, using a vacuum vapor deposition method, without involving decomposition of the fullerene or the derivative thereof as well as ring-opening of a dye configuring the chromophore. Thus, it is possible to simplify the manufacturing process and to construct a stable manufacturing process.

2. Application Examples

Application Example 1

Figure 7:
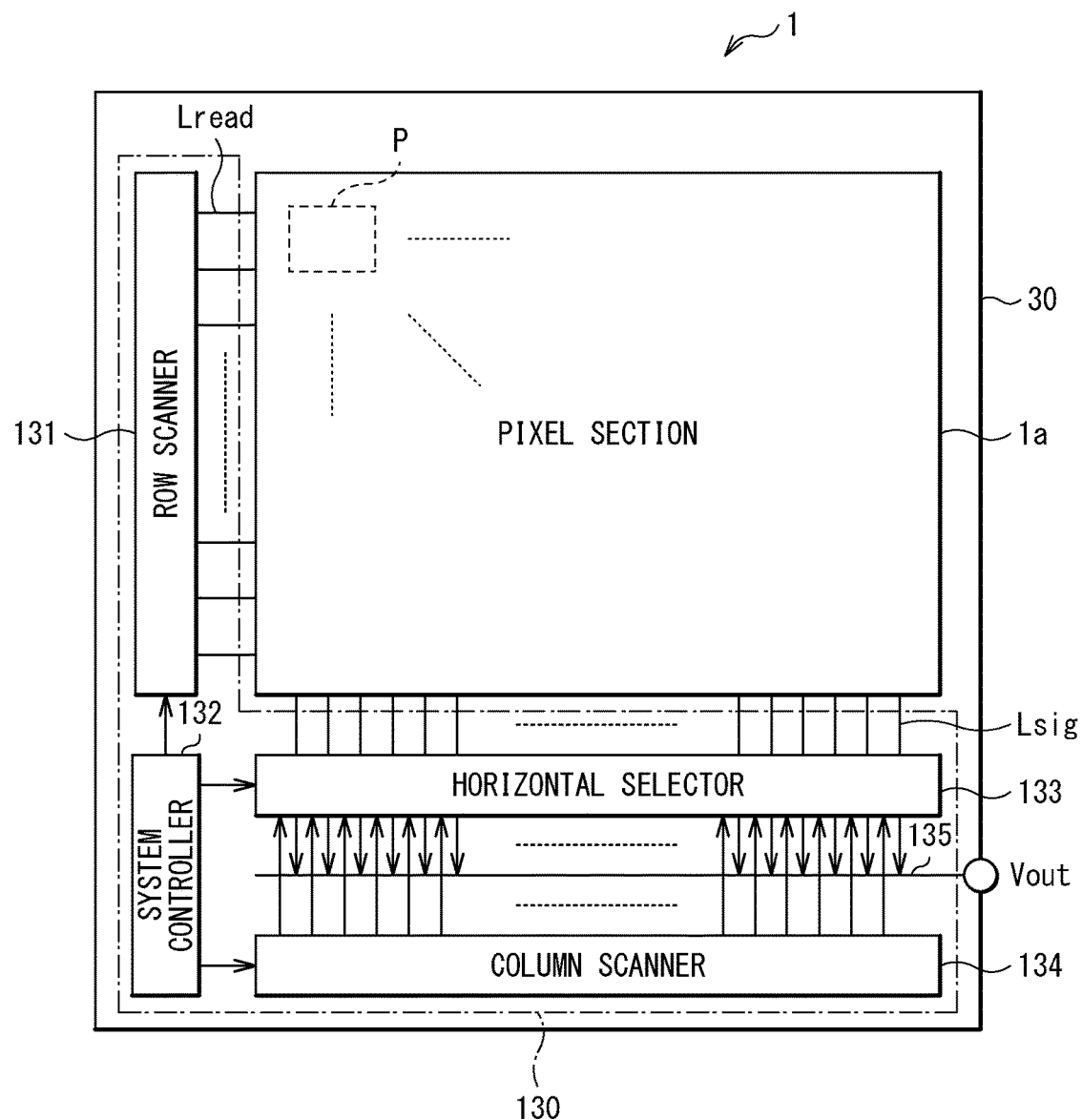
FIG. 7 is a block diagram illustrating an overall configuration of an imaging element provided with the photoelectric conversion element illustrated in FIG. 1.

FIG. 7 illustrates, for example, an overall configuration of the imaging device 1 in which the photoelectric conversion element 10 described in the foregoing embodiment is used for each pixel. The imaging device 1 is a CMOS imaging sensor. The imaging device 1 has a pixel section 1a as an imaging area on the semiconductor substrate 11, and includes, for example, a peripheral circuit section 130 configured by a row scanner 131, a horizontal selector 133, a column scanner 134, and a system controller 132 in a peripheral region of the pixel section 1a.

The pixel section 1a includes, for example, a plurality of unit pixels P (corresponding to, e.g., the photoelectric conversion elements 10) arranged two-dimensionally in matrix. To the unit pixels P, for example, pixel drive lines Lread (specifically, row selection lines and reset control lines) are wired on a pixel-row basis, and vertical signal lines Lsig are wired on a pixel-column basis. The pixel drive line Lread transmits a drive signal for reading of a signal from the pixel. One end of the pixel drive line Lread is coupled to an output terminal corresponding to each row in the row scanner 131.

The row scanner 131 is configured by a shift register, an address decoder, etc. The row scanner 131 is, for example, a pixel driver that drives the respective unit pixels P in the pixel section 1a on a row-unit basis. Signals outputted from the respective unit pixels P in the pixel row selectively scanned by the row scanner 131 are supplied to the horizontal selector 133 via the respective vertical signal lines Lsig. The horizontal selector 133 is configured by an amplifier, a horizontal selection switch, etc., that are provided for each vertical signal line Lsig.

The column scanner 134 is configured by a shift register, an address decoder, etc. The column scanner 134 sequentially drives the respective horizontal selection switches in the horizontal selector 133 while scanning the respective horizontal selection switches in the horizontal selector 133. As a result of the selective scanning by the column scanner 134, signals of the respective pixels to be transmitted via the respective vertical signal lines Lsig are sequentially outputted to horizontal signal lines 135, and are transmitted to the outside of the semiconductor substrate 11 through the horizontal signal lines 135.

A circuit part configured by the row scanner 131, the horizontal selector 133, the column scanner 134, and the horizontal signal lines 135 may be formed directly on the semiconductor substrate 11, or may be arranged in an external control IC. Alternatively, the circuit part may be formed on another substrate coupled with use of a cable, etc.

The system controller 132 receives a clock, data instructing an operation mode, etc., that are supplied from the outside of the semiconductor substrate 11. The system controller 132 also outputs data such as internal information of the imaging device 1. The system controller 132 further includes a timing generator that generates various timing signals, and performs drive control of peripheral circuits such as the row scanner 131, the horizontal selector 133, and the column scanner 134 on the basis of the various timing signals generated by the timing generator.

Application Example 2

Figure 8:
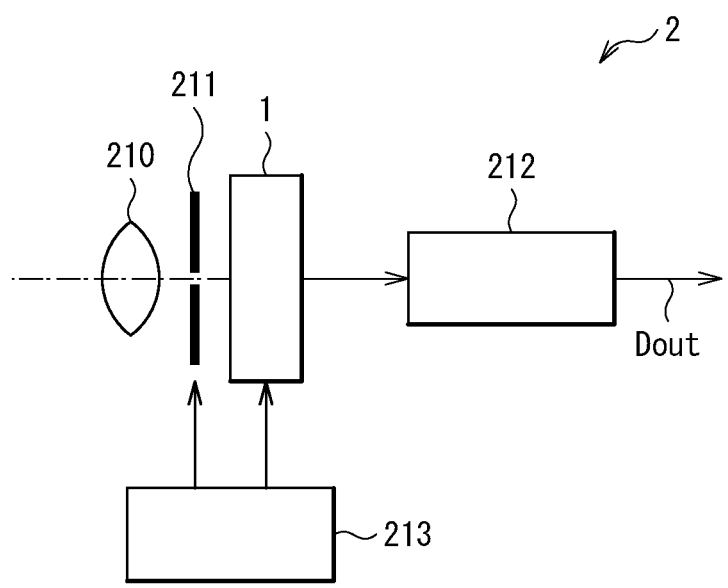
FIG. 8 is a functional block diagram illustrating an example of an imaging device (camera) using the imaging element illustrated in FIG. 7.

The above-described imaging device 1 is applicable to any type of electronic apparatus having an imaging function, for example, a camera system such as a digital still camera and a video camera, and a mobile phone having the imaging function. FIG. 8 illustrates an outline configuration of a camera 2 as an example thereof. This camera 2 is, for example, a video camera that is able to photograph a still image or shoot a moving image. The camera 2 includes, for example, the imaging device 1, an optical system (optical lens) 310, a shutter device 311, a drive section 313 that drives the imaging device 1 and the shutter device 311, and a signal processing section 312.

The optical system 310 guides image light (incident light) from a subject to the pixel section 1a in the imaging device 1. The optical system 310 may be configured by a plurality of optical lenses. The shutter device 311 controls periods of light irradiation and light shielding with respect to the imaging device 1. The drive section 313 controls a transfer operation of the imaging device 1 and a shutter operation of the shutter device 311. The signal processing section 312 performs various types of signal processing on a signal outputted from the imaging device 1. An image signal Dout after the signal processing is stored in a storage medium such as a memory, or outputted to a monitor, etc.

Application Example 3

<Example of Practical Application to In-Vivo Information Acquisition System>

Further, the technology according to an embodiment of the present disclosure (present technology) is applicable to various products. For example, the technology according to an embodiment of the present disclosure may be applied to an endoscopic surgery system.

Figure 9:
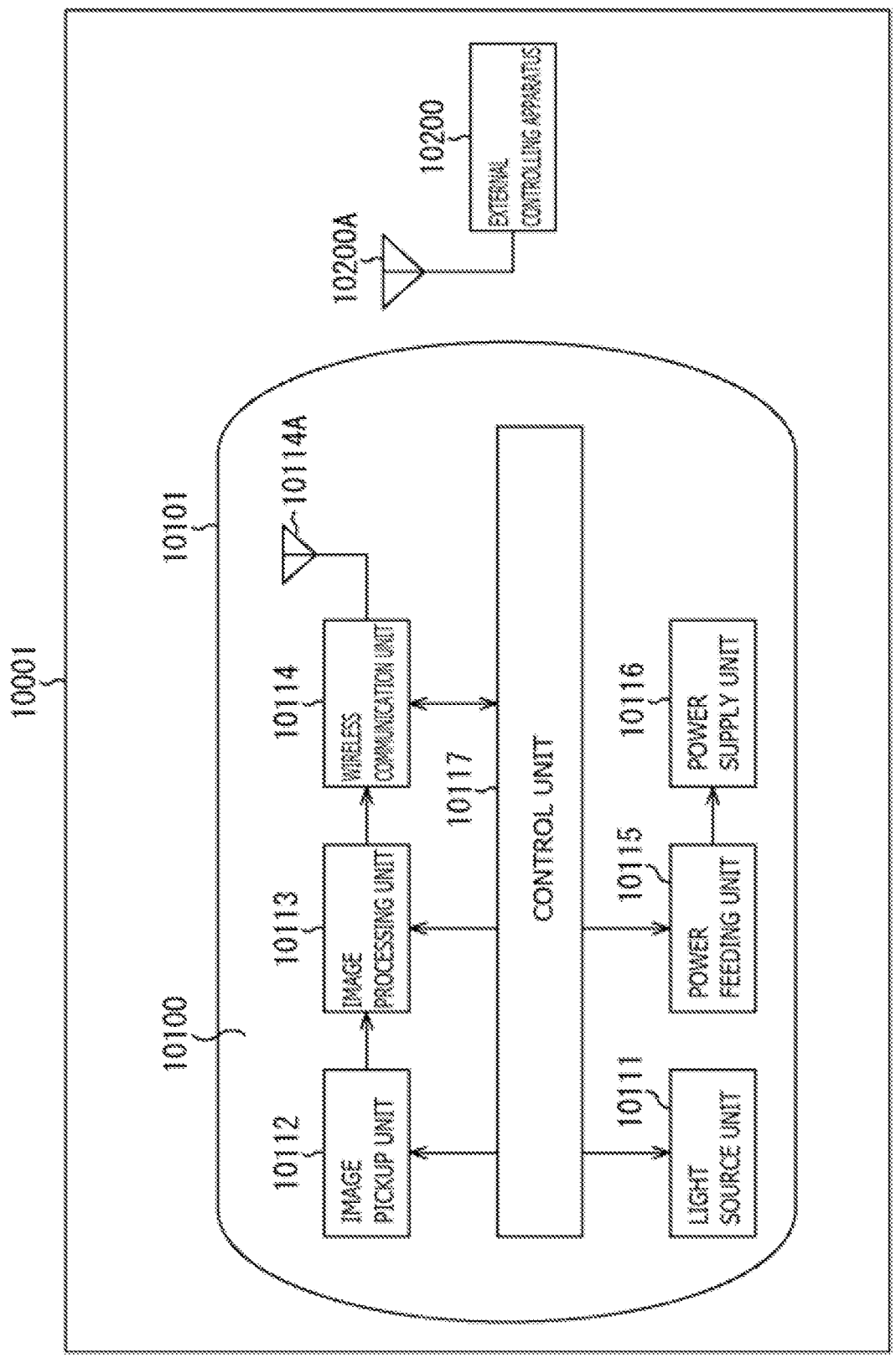
FIG. 9 is a block diagram depicting an example of a schematic configuration of an in-vivo information acquisition system.

FIG. 9 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 9, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

The description has been given above of one example of the in-vivo information acquisition system, to which the technology according to an embodiment of the present disclosure is applicable. The technology according to an embodiment of the present disclosure is applicable to, for example, the image pickup unit 10112 of the configurations described above. This makes it possible to improve detection accuracy.

Application Example 4

<Example of Practical Application to Endoscopic Surgery System>

The technology according to an embodiment of the present disclosure (present technology) is applicable to various products. For example, the technology according to an embodiment of the present disclosure may be applied to an endoscopic surgery system.

Figure 10:
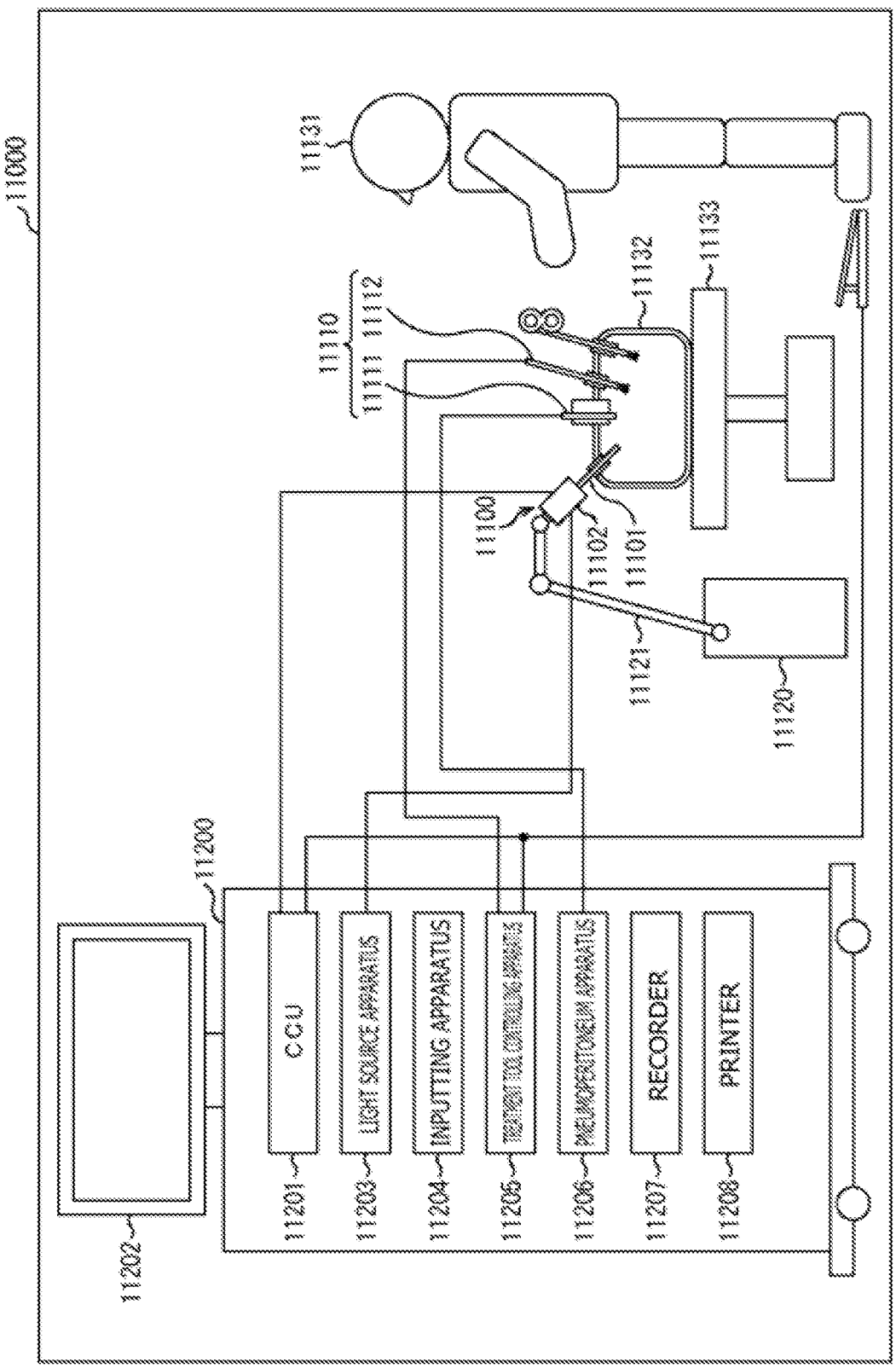
FIG. 10 is a view depicting an example of a schematic configuration of an endoscopic surgery system.

FIG. 10 is a view depicting an example of a schematic configuration of an endoscopic surgery system to which the technology according to an embodiment of the present disclosure (present technology) can be applied.

In FIG. 10, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photoelectrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 11:
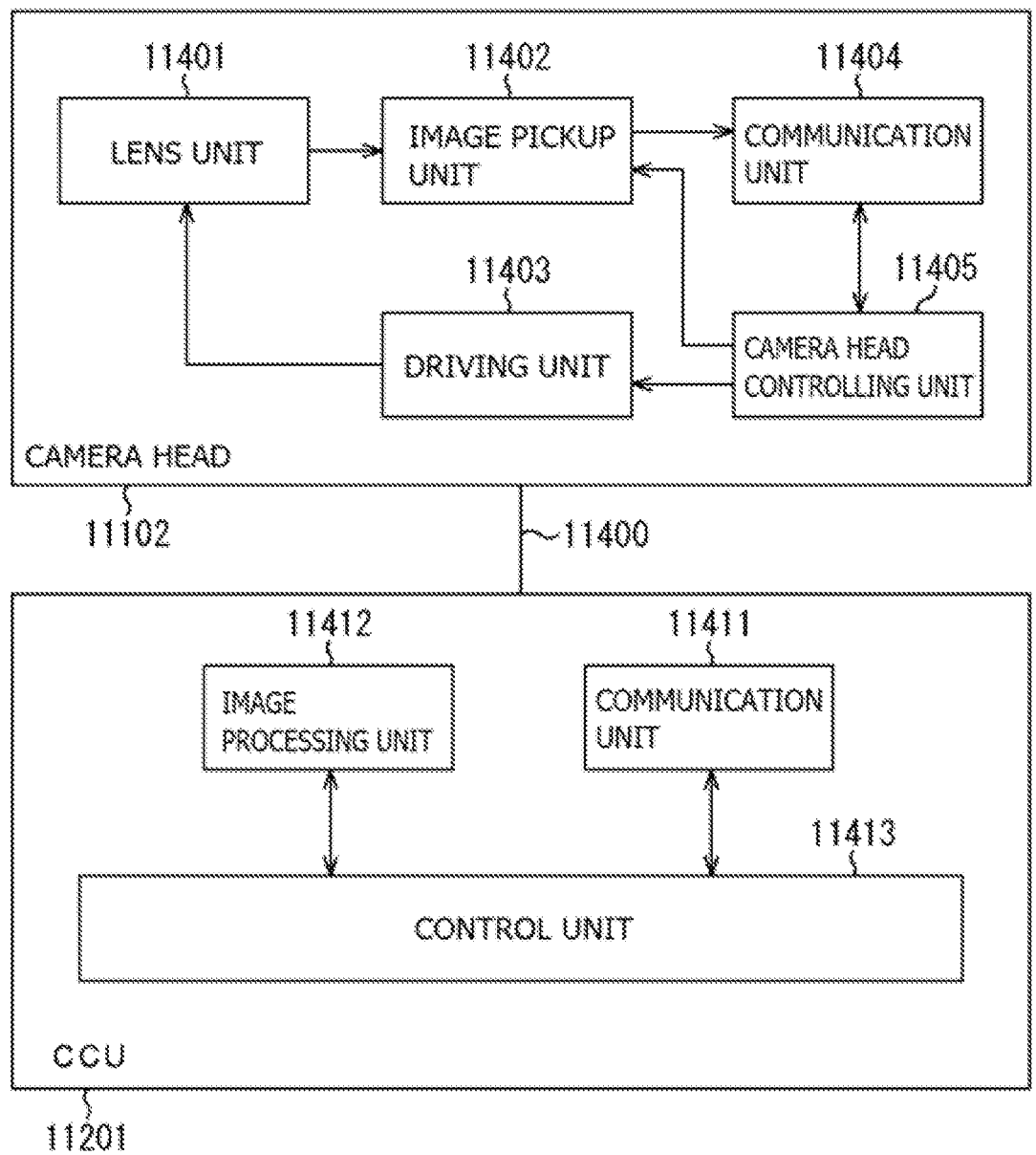
FIG. 11 is a block diagram depicting an example of a functional configuration of a camera head and a camera control unit (CCU).

FIG. 11 is a block diagram depicting an example of a functional configuration of the camera head 11102 and the CCU 11201 depicted in FIG. 10.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to, for example, the image pickup unit 11402 of the configurations described above. Applying the technology according to an embodiment of the present disclosure to the image pickup unit 11402 makes it possible to improve detection accuracy.

It is to be noted that although the endoscopic surgery system has been described as an example here, the technology according to an embodiment of the present disclosure may also be applied to, for example, a microscopic surgery system, and the like.

Application Example 5

<Example of Practical Application to Mobile Body>

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, a robot, a construction machine, and an agricultural machine (tractor).

Figure 12:
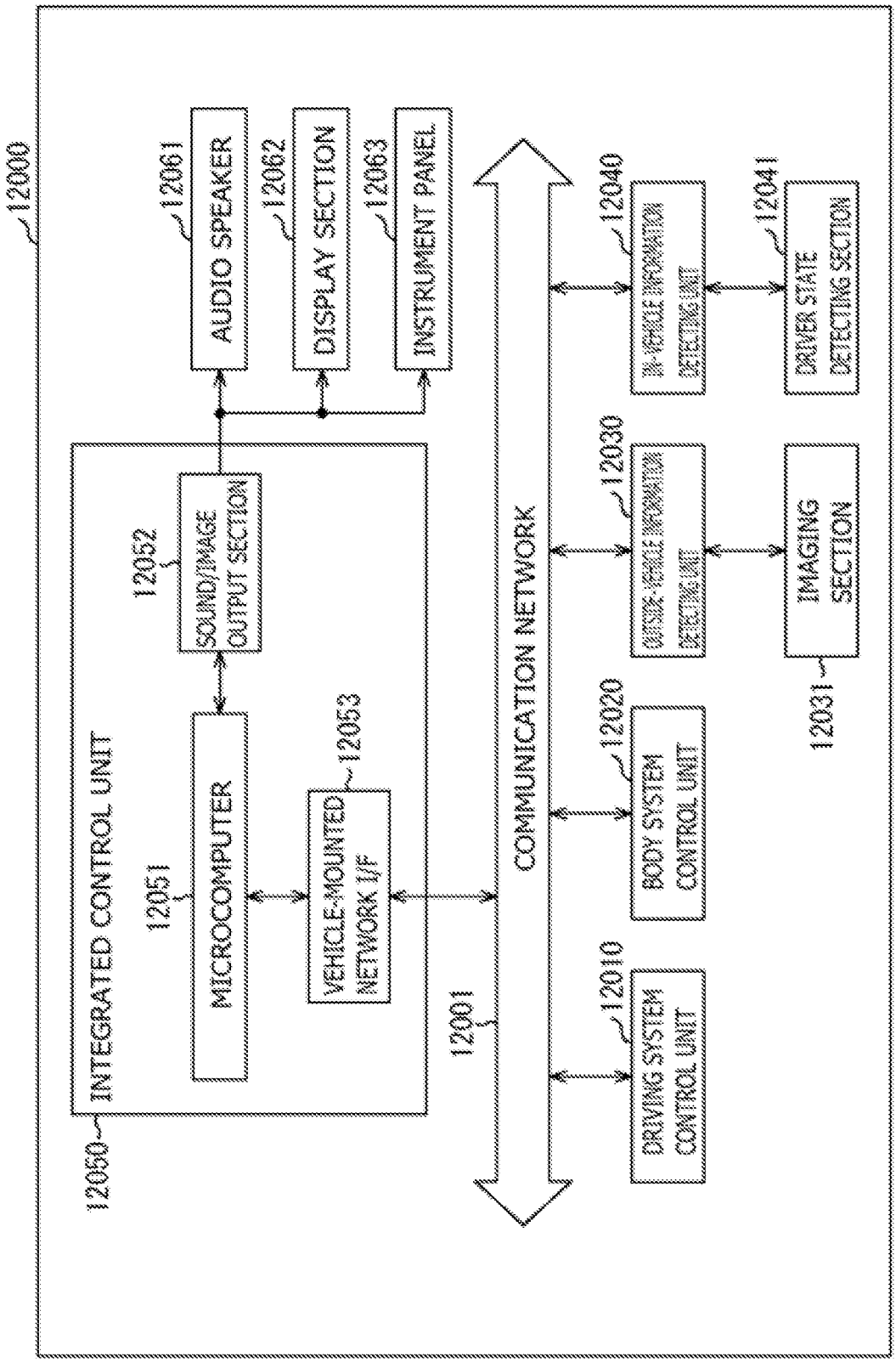
FIG. 12 is a block diagram depicting an example of schematic configuration of a vehicle control system.

FIG. 12 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 12, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 12, an audio speaker 12061, a display section 12062, and an instrument panel 12063 are illustrated as the output device. The display section 12062 may, for example, include at least one of an on-board display and a head-up display.

Figure 13:
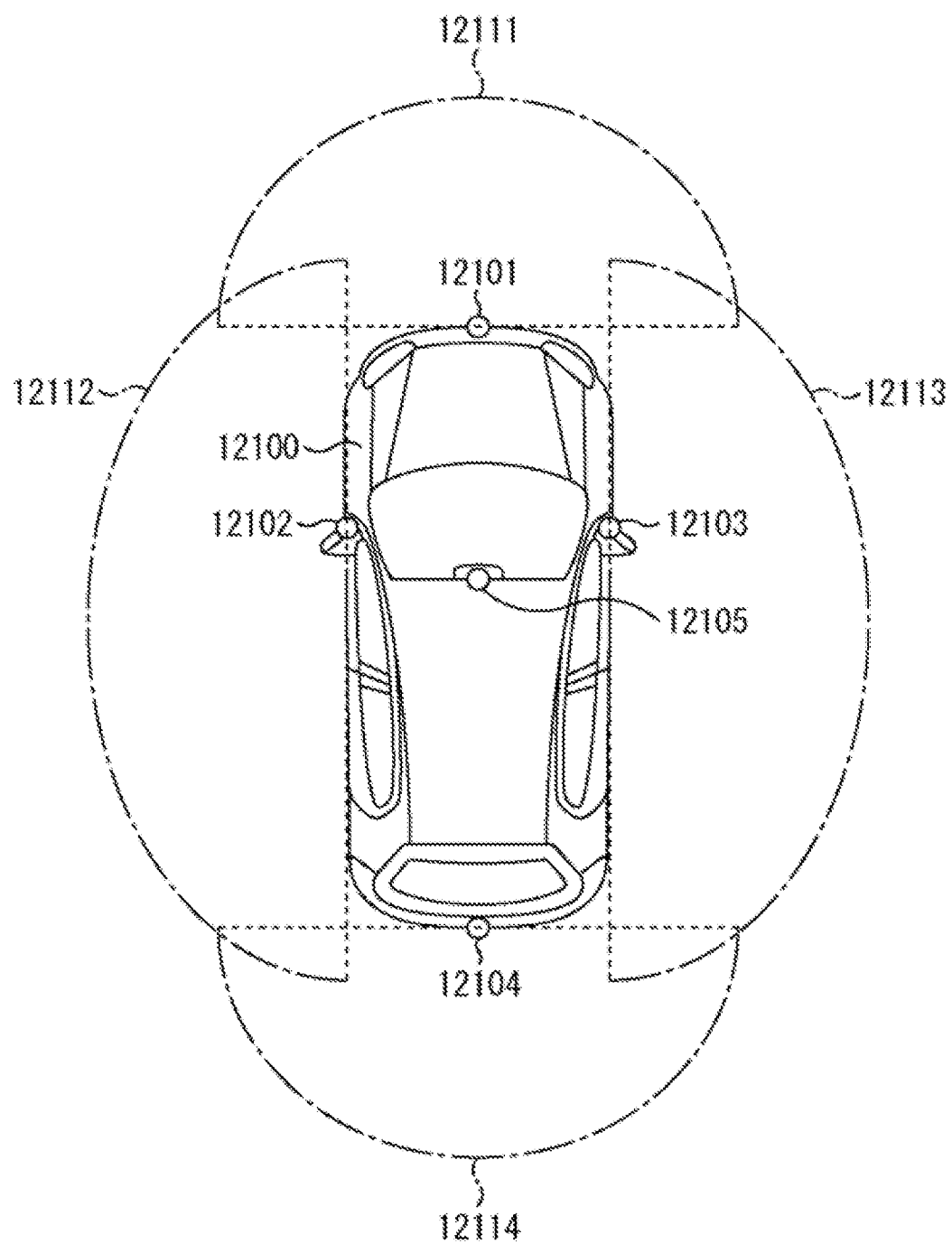
FIG. 13 is a diagram of assistance in explaining an example of installation positions of an outside-vehicle information detecting section and an imaging section.

FIG. 13 is a diagram depicting an example of the installation position of the imaging section 12031.

In FIG. 13, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 13 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

3. Working Examples

Next, description is given in detail of working examples of the present disclosure.

Experiment 1

In Experiment 1, a photoelectric conversion element using a chromophore with a crosslinking group in a molecule was prepared as each of Experimental Examples 1 and 2, and a photoelectric conversion element using a dye without a crosslinking group in a molecule was prepared as Experimental Example 3 to evaluate an external quantum efficiency (EQE) thereof and an open voltage (Voc) thereof.

First, a product resulting from the following scheme was sublimated and purified to obtain $F_6$-SubPc-O-2AN represented by the formula (1-1-6) as a chromophore of the present disclosure. In addition, a similar method was used to obtain $F_6$-SubPc-O-Ph-26$F_2$ represented by the following formula (4-1) with a crosslinking group in a molecule and $F_6$-SubPc-F represented by formula (4-2) without a crosslinking group in a molecule.

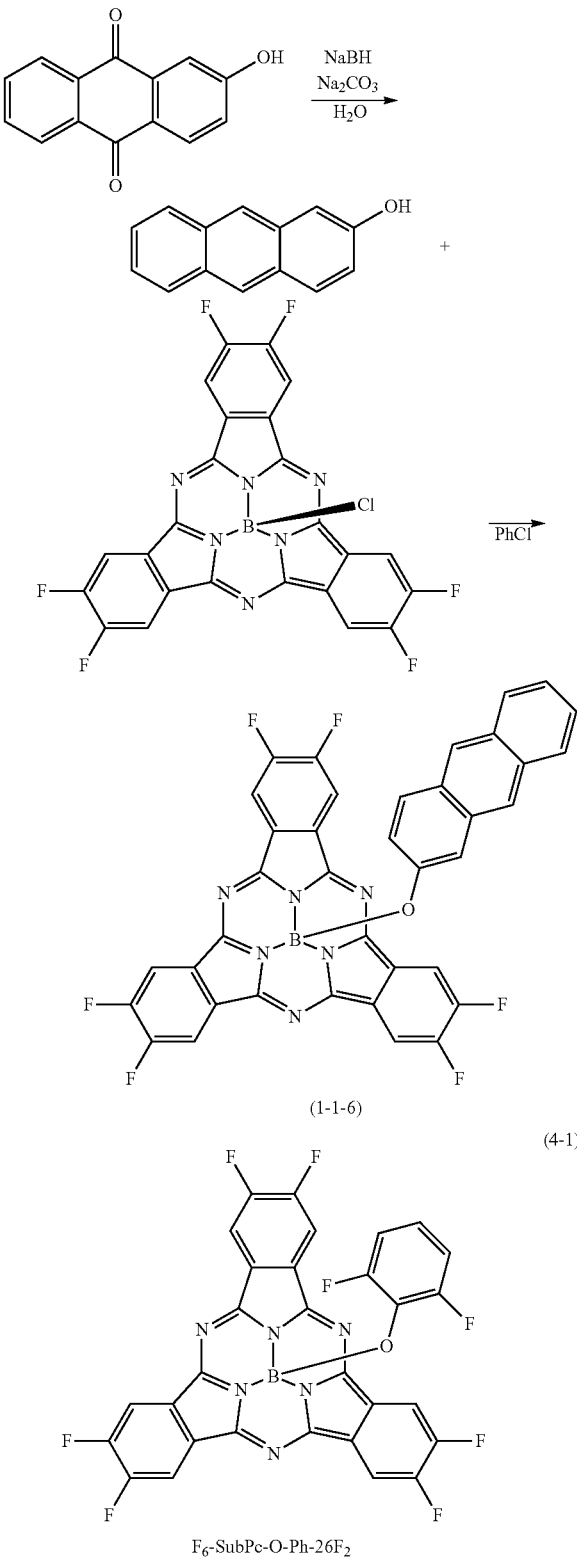

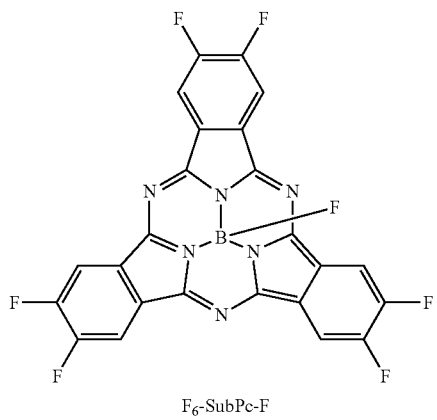

F$_6$-SubPc-F (4-2)

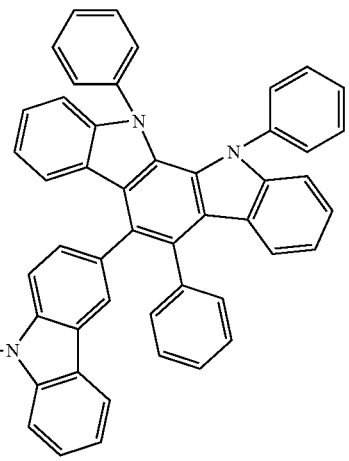

(5)

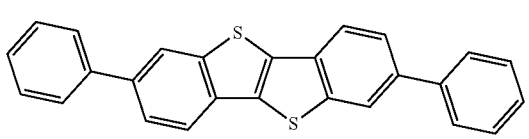

(6)

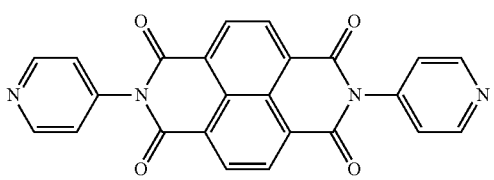

(7)

Experimental Example 1

An ITO film having a thickness of 100 nm was formed on a quartz substrate using a sputtering device. The ITO film was patterned by means of photolithography and etching to form an ITO electrode (lower electrode). Subsequently, after cleaning the quartz substrate provided with the ITO electrode by means of UV/ozone treatment, the quartz substrate was transferred to a vacuum vapor deposition equipment, and PC-IC represented by the following formula (5) was formed to have a thickness of 10 nm at a substrate temperature of 0° C. on the quartz substrate while rotating a substrate holder in a depressurized state of $1\times10^{-5}$ Pa or less to form an electron block layer. Next, F$_6$-SubPc-O-2AN represented by the formula (1-1-16), DPh-BTBT represented by the following formula (6), and C$_{60}$ fullerene were formed as films at film-forming rates of 0.50 Å per second, 0.50 Å per second, and 0.25 Å per second, respectively, and at a substrate temperature of 40° C. to have a mixed-layer thickness of 230 nm, thus forming a photoelectric conversion layer. Subsequently, an NDI-35 represented by the following formula (7) was formed, as a film, to have a thickness of 10 nm at a substrate temperature of 0° C., thus forming a hole block layer. Finally, the quartz substrate was transferred to the sputtering device, and an ITO film was formed to have a thickness of 50 nm on the hole block layer, thus forming an upper electrode. In accordance with the above-described preparation method, a photoelectric conversion element (Experimental Example 1) having a photoelectric conversion region of 1 mm×1 mm was prepared.

Experimental Example 2

A photoelectric conversion element (Experimental Example 2) was prepared using a method similar to that in Experimental Example 1 except that the F$_6$-SubPc-O-Ph-26F$_2$ represented by the above formula (4-1) was used instead of the F$_6$-SubPc-O-2AN (formula (1-1-16)) used in Experimental Example 1.

Experimental Example 3

A photoelectric conversion element (Experimental Example 3) was prepared using a method similar to that in Experimental Example 1 except that the F$_6$-SubPc-F represented by the above (formula (4-2)) was used instead of the F$_6$-SubPc-O-2AN (formula (1-1-16)) used in Experimental Example 1.

The external quantum efficiency (EQE), open voltage (Voc), form factor (f.f.) and a photoelectric conversion efficiency (TO) of each of Experimental Examples 1 to 3 were evaluated using the following method. The results are summarized in Table 1 together with chromophores (dyes) used in respective experimental examples.

A current-voltage curve was obtained by controlling a bias voltage to be applied between electrodes of the photoelectric conversion element using a semiconductor parameter analyzer and sweeping a voltage applied to the lower electrode with respect to the upper electrode, with a wavelength and a light amount of light irradiated to the photoelectric conversion element from a green LED light source via a band-pass filter being set to 560 nm and to 1.62

μW/cm$^2$, respectively. The EQE was calculated by measuring a light current value and a dark current value in a short-circuit state. The open voltage (Voc) was determined from a voltage in the open state. The photoelectric conversion efficiency (TO) was determined by dividing the maximum power in the current-voltage curve by irradiation energy of green light. The form factor (f.f) was calculated by dividing the photoelectric conversion efficiency (TO) by a product of the current in the short-circuit state and the open voltage (Voc).

(Evaluation of Reaction Product between Chromophore (or Dye) and C$_{60}$ Fullerene)

A mixed film having a thickness of 150 nm and a ratio of 2:1 between the chromophores (or dyes) and the C$_{60}$ fullerene used in each of Experimental Examples 1 to 3 was formed on a silicon substrate using a vacuum vapor deposition equipment; gold (Au) was vapor-deposited on the mixed film to have a thickness of 100 nm to prepare evaluation samples. An evaluation sample not subjected to anneal treatment and an evaluation sample subjected to anneal treatment at 150° C. under an atmosphere substituted by nitrogen were prepared. High-sensitivity reflection infrared spectroscopy (IRRAS) was measured by irradiating the respective evaluation samples with infrared rays from side of the silicon substrate and by subjecting the infrared rays to multiple reflection between the Au and the substrate. The presence or absence of a reaction product between the chromophore (or dye) and the C$_{60}$ fullerene was confirmed by confirming, from a change in the spectrum of IRRAS, the presence or absence of a change in an oscillation peak derived from a crosslinking group before and after the annealing.

chromophore as represented by the formula (4-1), no change was observed by the high-sensitivity infrared spectroscopy in the oscillation peak derived from the crosslinking group before and after the annealing. It was found, from the above, that the crosslinking group of the F$_6$-SubPc-O-Ph-26F$_2$ and the C$_{60}$ fullerene did not react with each other. In addition, the F$_6$-SubPc-F used in Experimental Example 3 includes the subphthalocyanine chromophore, but no crosslinking group of the conjugated diene, as represented by the formula (4-2). Therefore, no change was observed by the high-sensitivity infrared spectroscopy in the oscillation peak derived from the crosslinking group before and after the annealing.

It is to be noted that analysis of chemical compositions in the photoelectric conversion layer using a matrix-assisted laser desorption ionization time-of-flight mass spectrometer (MALDI-TOF-MS) may also be adopted to confirm the presence or absence of a reaction product between the chromophore (or dye) and the C$_{60}$ fullerene.

A mixed film having a thickness of 150 nm and a ratio of 2:1 between the chromophores (or dyes) and the C$_{60}$ fullerene used in each of Experimental Examples 1 to 3 was formed on a silicon substrate using a vacuum vapor deposition equipment to prepare an evaluation sample. In the evaluation sample corresponding to Experimental Example 1, a chemical composition having a molecular weight in which the F$_6$-SubPc-O-2AN and the C$_{60}$ fullerene were added at 1:1 was detected from a mixed film before the annealing, whereas no adduct was detected from the mixed film after the annealing. When examining this result and the result of the above-mentioned high-sensitivity infrared reflection spectroscopy, this is considered because the

TABLE 1

| | Chromophore | Presence or Absence of Crosslinking Group (Conjugated Diene) | Presence or Absence of Reaction Product between Dye and C$_{60}$ | EQE (%) | Voc (V) | f.f. | η (%) |
|---|---|---|---|---|---|---|---|
| Experimental Example 1 | Formula (1-1-6) | Present | Present | 53 | 0.65 | 0.18 | 2.8 |
| Experimental Example 2 | Formula (3-1) | Present | Absent | 53 | 0.58 | 0.14 | 2.0 |
| Experimental Example 3 | Formula (3-2) | Absent | Absent | 53 | 0.37 | 0.18 | 1.6 |

Figure 14:
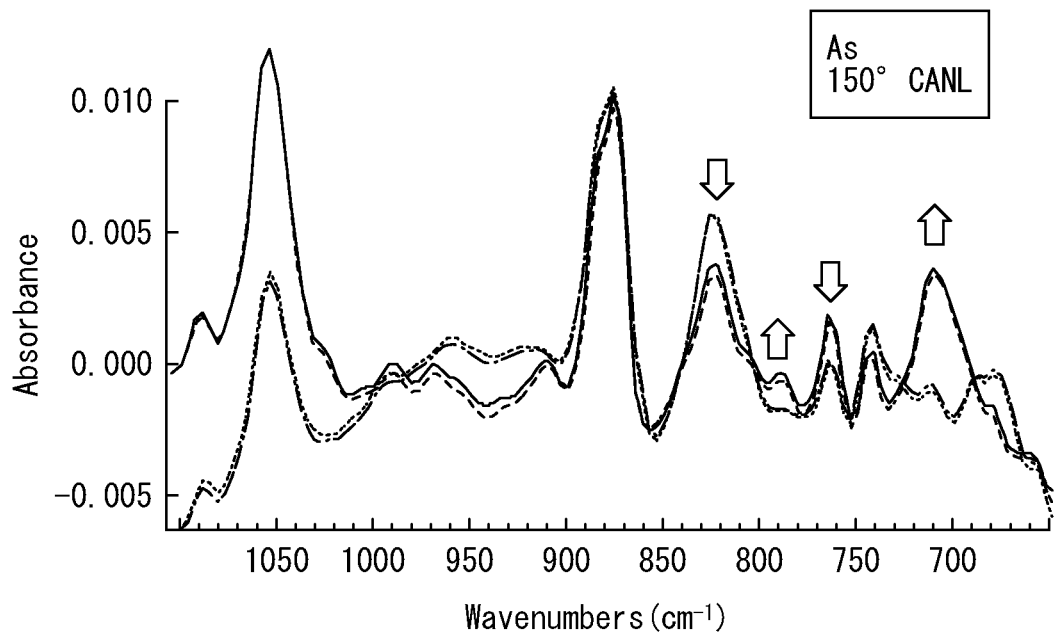
FIG. 14 is a characteristic diagram illustrating a change in oscillation peaks derived from a crosslinking group before and after annealing in Experimental Example 1.
Figure 15:
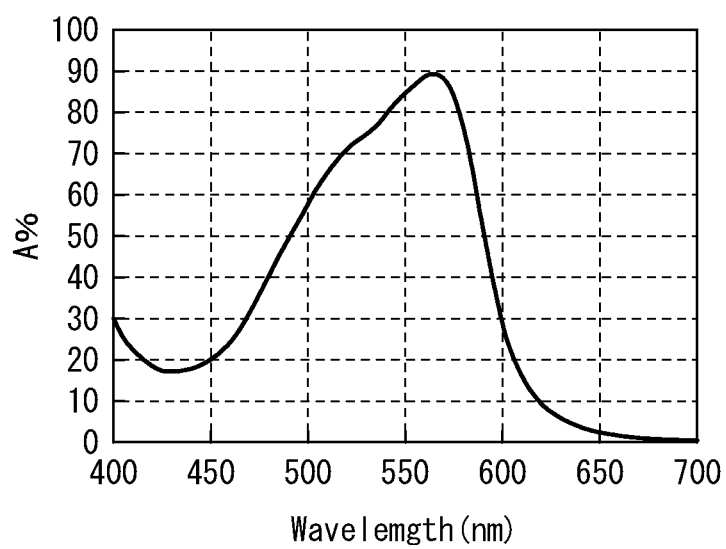
FIG. 15 is a characteristic diagram illustrating an absorption spectrum of a photoelectric conversion layer before and after the annealing in Experimental Example 1.

The F$_6$-SubPc-O-2AN used in Experimental Example 1 has a structure in which a crosslinking group of a conjugated diene is introduced into subphthalocyanine chromophore, as appreciated from the formula (1-1-16). It was confirmed, in a photoelectric conversion layer including the F$_6$-SubPc-O-2AN and the C$_{60}$ fullerene, that the crosslinking group and the C$_{60}$ fullerene reacted with each other, because a change was observed in the oscillation peak derived from the crosslinking group before and after the annealing by the high-sensitivity infrared reflection spectroscopy as illustrated in FIG. 14. In addition, FIG. 15 illustrates a change in an absorption spectrum of a photoelectric conversion layer before and after the annealing. It was found, in Experimental Example 1, that there was no change in absorption derived from the chromophore before and after the annealing, i.e., before and after the reaction of the crosslinking group.

In contrast, although the F$_6$-SubPc-O-Ph-26F$_2$ used in Experimental Example 2 includes a crosslinking group of a conjugated diene with respect to the subphthalocyanine chemical composition generated by a Diels-Alder reaction between an anthracene site of the F$_6$-SubPc-O-2AN and the C$_{60}$ fullerene was formed before the annealing, and the crosslinking was removed after the annealing. Accordingly, it is presumed that radiant heat and substrate heating upon film formation by means of vacuum vapor deposition caused the above chemical composition to be generated through a crosslinking reaction, and that the crosslinking was dissociated by the subsequent annealing.

Meanwhile, in the evaluation sample corresponding to Experimental Example 2, no adduct of each chemical species was detected from the mixed film before and after the annealing. In addition, no adduct of each chemical species was detected either from the mixed film before and after the annealing in the evaluation sample corresponding to Experimental Example 3. It is considered, from this result, that no Diels-Alder reaction with the C$_{60}$ fullerene occurred in the F$_6$-SubPc-O-Ph-26F$_2$ and in the F$_6$-SubPc-F.

As for the EQE and the open voltage (Voc), Experimental Example 1 exhibited an EQE of 53% and a Voc of 0.652 V;

it was found that Experimental Example 1 exhibited higher Voc, although the EQE was equivalent, as compared with Experimental Examples 2 and 3. This is considered because, in Experimental Example 1, the $F_6$-SubPc-O-2AN was bonded to the $C_{60}$ fullerene via an anthracene substituent at an axial position of the subphthalocyanine chromophore, thereby allowing orientations of the chromophore and the $C_{60}$ fullerene as well as a distance therebetween to be fixed to desired states for the photoelectric conversion while imparting an energy change to the $C_{60}$ fullerene, although there was no change in the optical absorption wavelength of the subphthalocyanine chromophore. It is considered that this caused a LUMO level of the $C_{60}$ fullerene to be shifted toward high energy side, thus improving an electron transfer efficiency or an energy transfer efficiency between the chromophore and the $C_{60}$ fullerene, and further reducing the orientations of the chromophore and the $C_{60}$ fullerene, which may form a trap. As a result, it is considered that a photoelectric conversion element having high photoelectric conversion characteristics was achieved.

Experimental Example 2

In Experiment 2, a photoelectric conversion element using an organic material with a crosslinking group in a molecule and including a reaction product between the dye and the $C_{60}$ fullerene was prepared as each of Experimental Examples 4 and 6, and a photoelectric conversion element using an organic material with a crosslinking group in a molecule but not including a reaction product between the dye and the $C_{60}$ fullerene was prepared as each of Experimental Examples 5 and 7 to evaluate the EQE thereof and the standardized response speed thereof

Experimental Example 4

A photoelectric conversion element (Experimental Example 4) using a method similar to that in Experimental Example 1 was prepared to evaluate photoelectric conversion characteristics upon voltage application in a reverse direction of a diode.

Experimental Example 5

A photoelectric conversion element (Experimental Example 5) with crosslinking being dissociated was prepared by performing formation up to an upper electrode using a method similar to that in Experimental Example 1 and then performing annealing, to evaluate photoelectric conversion characteristics upon voltage application in a reverse direction of a diode.

Experimental Example 6

A photoelectric conversion element (Experimental Example 6) with crosslinking being generated was prepared by using $F_6$-SubPc-O-β-BT represented by the following formula (1-1-16) instead of the $F_6$-SubPc-O-2AN (formula (1-1-16)) used in Experimental Example 1 and by performing formation up to an upper electrode and then performing annealing, to evaluate photoelectric conversion characteristics upon voltage application in a reverse direction of a diode. Note that it was confirmed, from analysis results using the IRRAS and the MALDI-TOF-MS, that, in a case where the $F_6$-SubPc-O-β-BT was used, a crosslinking reaction did not occur before the anneal treatment, and that the crosslinking reaction occurred after the annealing.

Experimental Example 7

A photoelectric conversion element (Experimental Example 7) was prepared using a method similar to that in Experimental Example 1, except that the $F_6$-SubPc-O-β-BT represented by the following formula (1-1-16) was used instead of the $F_6$-SubPc-O-2AN (formula (1-1-16)) used in Experimental Example 1 to evaluate photoelectric conversion characteristics upon voltage application in a reverse direction of a diode.

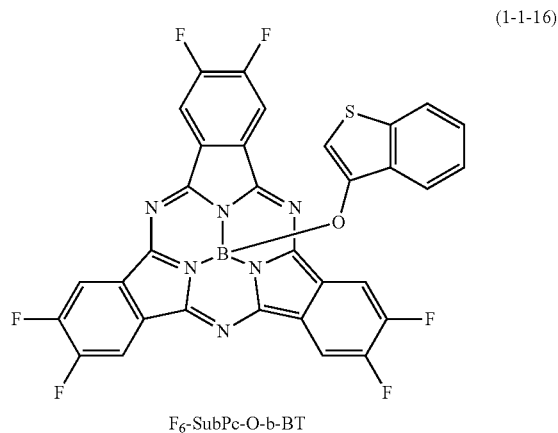

$F_6$-SubPc-O-b-BT (1-1-16)

The external quantum efficiency (EQE) and the standardized response speed upon voltage application in each of Experimental Examples 4 to 7 were evaluated using the following method. The results are summarized in Table 2 together with chromophores (dyes) used in respective experimental examples.

A wavelength and a light amount of light irradiated to a photoelectric conversion element from a green LED light source via a band-pass filter was set to 560 nm and to 162 μW/cm$^2$, respectively, and a bias voltage to be applied between electrodes of the photoelectric conversion element was controlled using a semiconductor parameter analyzer; a light current value and a dark current value were measured in such a state where a voltage of 2.6 V was applied to a lower electrode on negative bias side with respect to an upper electrode to calculate the EQE. In addition, light was irradiated with the 2.6 V being applied, followed by observation of a constant current, and thereafter the light irradiation was stopped immediately to quantify a speed at which the current was decaying with an amount of charges flowing at that time and to adopt the speed as an index of responsiveness. In the present experiment, comparison was made using standardized response speeds in which a response speed of Experimental Example 4 was set to 1.60.

TABLE 2

| | Chromo-phore | Presence or Absence of Cross-linking Group (Conjugated Diene) | Presence or Absence of Reaction Product between Dye and $C_{60}$ | EQE (%) | Standard-ized Response Speed |
|---|---|---|---|---|---|
| Experimental Example 4 | Formula (1-1-6) | Present | Present | 72 | 1.60 |
| Experimental Example 5 | Formula (1-1-6) | Present | Absent | 70 | 4.80 |
| Experimental Example 6 | Formula (1-1-16) | Present | Present | 56 | 4.30 |
| Experimental Example 7 | Formula (1-1-16) | Present | Absent | 56 | 6.13 |

The photoelectric conversion element of Experimental Example 4 exhibited a higher EQE and a faster standardized response speed than the photoelectric conversion element of Experimental Example 5 upon application of a voltage of 2.6 V. This is considered because, in Experimental Example 4, the $F_6$-SubPc-O-2AN was bonded to the $C_{60}$ fullerene via an anthracene substituent at an axial position of the subphthalocyanine chromophore, thereby allowing orientations of the chromophore and the $C_{60}$ fullerene as well as a distance therebetween to be fixed to desired states for the photoelectric conversion while imparting an energy change to the $C_{60}$ fullerene, although there was no change in the optical absorption wavelength of the subphthalocyanine chromophore. It is considered that this caused a LUMO level of the $C_{60}$ fullerene to be shifted toward high energy side, thus improving an electron transfer efficiency or an energy transfer efficiency between the chromophore and the $C_{60}$ fullerene, and further reducing the orientations of the chromophore and the $C_{60}$ fullerene, which may form a trap. As a result, it is considered that a photoelectric conversion element having high photoelectric conversion characteristics as well as a faster response speed was achieved.

The photoelectric conversion element of Experimental Example 6 exhibited an equivalent EQE and a faster standardized response speed as compared with the photoelectric conversion element of Experimental Example 7 upon application of a voltage of 2.6 V. This is considered because, in Experimental Example 6, the $F_6$-SubPc-O-β-BT was bonded to the $C_{60}$ fullerene via a benzothiophene substituent at an axial position of the subphthalocyanine chromophore, thereby allowing orientations of the chromophore and the $C_{60}$ fullerene as well as a distance therebetween to be fixed to desired states for the photoelectric conversion while imparting an energy change to the $C_{60}$ fullerene, although there was no change in the optical absorption wavelength of the subphthalocyanine chromophore. It is considered that this caused a LUMO level of the $C_{60}$ fullerene to be shifted toward high energy side, thus improving an electron transfer efficiency or an energy transfer efficiency between the chromophore and the $C_{60}$ fullerene, and further reducing the orientations of the chromophore and the $C_{60}$ fullerene, which may form a trap. As a result, it is considered that a photoelectric conversion element having high photoelectric conversion characteristics as well as a faster response speed was achieved.

Description has been given hereinabove referring to the embodiment and the working examples; however, the content of the present disclosure is not limited to the foregoing embodiment and the like, and various modifications may be made. For example, in the foregoing embodiment, the photoelectric conversion element has a configuration in which the organic photoelectric conversion section 11G that detects green light, and the inorganic photoelectric conversion section 11B and the inorganic photoelectric conversion section 11R that detect blue light and red light, respectively, are stacked. However, the content of the present disclosure is not limited to such a structure. In other words, red light or blue light may be detected in the organic photoelectric conversion section, and green light may be detected in the inorganic photoelectric conversion section.

In addition, the numbers of the organic photoelectric conversion section and inorganic photoelectric conversion section, and the ratio therebetween are not limitative. Two or more organic photoelectric conversion sections may be provided, or color signals of a plurality of colors may be obtained only by the organic photoelectric conversion section. Furthermore, the structure in which the organic photoelectric conversion section and the inorganic photoelectric conversion section are stacked in the vertical direction is not limitative; the organic photoelectric conversion section and the inorganic photoelectric conversion section may be arranged side by side along a substrate surface.

Further, the foregoing embodiment, etc. exemplifies the configuration of the backside illumination type solid-state imaging device; however, the content of the present disclosure is also applicable to a front-side illumination type solid-state imaging device. Further, the photoelectric conversion element of the present disclosure does not necessarily include all of the components described in the foregoing embodiment, and may include any other layer, conversely.

Furthermore, the foregoing embodiment, etc. exemplifies the photoelectric conversion element 10 as an imaging element that configures the imaging device 1; however, the photoelectric conversion element 10 of the present disclosure may also be applied to a solar cell.

It is to be noted that the effects described herein are merely exemplary and are not limitative, and may further include other effects.

It is to be noted that the present disclosure may have the following configurations.

(1)
A photoelectric conversion element including:
  a first electrode;
  a second electrode disposed to be opposed to the first electrode; and
  a photoelectric conversion layer provided between the first electrode and the second electrode, the photoelectric conversion layer including a chromophore, fullerene or a fullerene derivative, and a hole-transporting material,
  the chromophore and the fullerene or the fullerene derivative being bonded to each other at least partially via a crosslinking group in the photoelectric conversion layer.

(2)
The photoelectric conversion element according to (1), in which the chromophore includes an organic molecule having absorption in a visible-light region, and includes the crosslinking group.

(3)
The photoelectric conversion element according to (1) or (2), in which the chromophore has a change within ±10 nm in an absorption peak wavelength before and after the bonding to the fullerene or the fullerene derivative via the crosslinking group.

(4)

The photoelectric conversion element according to any one of (1) to (3), in which the crosslinking group includes a conjugated diene.

(5)

The photoelectric conversion element according to any one of (1) to (4), in which one or two or more molecules of the chromophore are each bonded to one molecule of the fullerene or the fullerene derivative via the crosslinking group.

(6)

The photoelectric conversion element according to any one of (1) to (5), in which the fullerene or the fullerene derivative includes $C_{60}$ fullerene or $C_{70}$ fullerene.

(7)

The photoelectric conversion element according to (5) or (6), in which the chromophore includes subphthalocyanine, porphyrin, phthalocyanine, dipyrromethane, azadipyrromethane, dipyridyl, azadipyridyl, coumarin, perylene, perylene diimide, pyrene, naphthalene diimide, quinacridone, xanthene, xanthenoxanthene, phenoxazine, indigo, azo, oxazine, benzodithiophene, naphthodithiophene, anthradithiophene, rubicene, anthracene, tetracene, pentacene, anthraquinone, tetraquinone, pentaquinone, dinaphthothienothiophene, diketopyrrolopyrrole, oligothiophene, cyanine, squalium, croconium, or a derivative thereof.

(8)

The photoelectric conversion element according to any one of (5) to (7), in which the crosslinking group includes one of benzene, naphthalene, anthracene, tetracene, pentacene, cyclopentadiene, indene, furan, thiophene, benzofuran, benzothiophene, and 1,3-butadiene.

(9)

The photoelectric conversion element according to any one of (5) to (8), in which the hole-transporting material has a highest occupied molecular orbital level higher than the fullerene or the fullerene derivative.

(10)

A photoelectric conversion element including:
a first electrode;
a second electrode disposed to be opposed to the first electrode; and
a photoelectric conversion layer provided between the first electrode and the second electrode, the photoelectric conversion layer being formed, as a film, by a chromophore and fullerene or a fullerene derivative by means of a vacuum vapor deposition method, the chromophore and the fullerene or the fullerene derivative being bonded to each other at least partially via a crosslinking group.

(11)

The photoelectric conversion element according to (10), in which the chromophore includes an organic molecule having absorption in a visible-light region, and includes the crosslinking group.

(12)

The photoelectric conversion element according to (10) or (11), in which the chromophore has a change within ±10 nm in an absorption peak wavelength before and after the bonding to the fullerene or the fullerene derivative via the crosslinking group.

(13)

The photoelectric conversion element according to any one of (10) to (12), in which the photoelectric conversion layer further includes a hole-transporting material.

(14)

A method of manufacturing a photoelectric conversion element, the method including:
forming a first electrode;
forming, on the first electrode, a photoelectric conversion layer that includes a chromophore, fullerene or a fullerene derivative, and a hole-transporting material, the chromophore and the fullerene or the fullerene derivative being bonded to each other at least partially via a crosslinking group; and forming a second electrode on the photoelectric conversion layer.

(15)

The method of manufacturing the photoelectric conversion element according to (14), in which the formation of the photoelectric conversion layer includes using a vacuum vapor deposition method.

(16)

The method of manufacturing the photoelectric conversion element according to (14) or (15), in which the bonding between the chromophore and the fullerene or the fullerene derivative via the crosslinking group is performed by heat or light irradiation upon vacuum vapor deposition or by heating or light irradiation after film formation.

(17)

A method of manufacturing a photoelectric conversion element, the method including:
forming a first electrode;
forming, on the first electrode, a photoelectric conversion layer that includes a chromophore and fullerene or a fullerene derivative, the chromophore and the fullerene or the fullerene derivative being bonded to each other at least partially via a crosslinking group; and
forming a second electrode on the photoelectric conversion layer.

(18)

The method of manufacturing the photoelectric conversion element according to (17), in which the formation of the photoelectric conversion layer further includes addition of a hole-transporting material.

This application claims the benefit of Japanese Priority Patent Application JP2018-104374 filed with the Japan Patent Office on May 31, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A photoelectric conversion element comprising:
a first electrode;
a second electrode disposed to be opposed to the first electrode; and
a photoelectric conversion layer provided between the first electrode and the second electrode, the photoelectric conversion layer including a chromophore, fullerene or a fullerene derivative, and a hole-transporting material,
the chromophore and the fullerene or the fullerene derivative being bonded to each other at least partially via a crosslinking group in the photoelectric conversion layer.

2. The photoelectric conversion element according to claim 1, wherein the chromophore comprises an organic molecule having absorption in a visible-light region, and includes the crosslinking group.

3. The photoelectric conversion element according to claim 1, wherein the chromophore has a change within ±10 nm in an absorption peak wavelength before and after the bonding to the fullerene or the fullerene derivative via the crosslinking group.

4. The photoelectric conversion element according to claim 1, wherein the crosslinking group comprises a conjugated diene.

5. The photoelectric conversion element according to claim 1, wherein one or two or more molecules of the chromophore are each bonded to one molecule of the fullerene or the fullerene derivative via the crosslinking group.

6. The photoelectric conversion element according to claim 1, wherein the fullerene or the fullerene derivative comprises $C_{60}$ fullerene or $C_{70}$ fullerene.

7. The photoelectric conversion element according to claim 5, wherein the chromophore comprises subphthalocyanine, porphyrin, phthalocyanine, dipyrromethane, azadipyrromethane, dipyridyl, azadipyridyl, coumarin, perylene, perylene diimide, pyrene, naphthalene diimide, quinacridone, xanthene, xanthenoxanthene, phenoxazine, indigo, azo, oxazine, benzodithiophene, naphthodithiophene, anthradithiophene, rubicene, anthracene, tetracene, pentacene, anthraquinone, tetraquinone, pentaquinone, dinaphthothienothiophene, diketopyrrolopyrrole, oligothiophene, cyanine, squalium, croconium, or a derivative thereof.

8. The photoelectric conversion element according to claim 5, wherein the crosslinking group comprises one of benzene, naphthalene, anthracene, tetracene, pentacene, cyclopentadiene, indene, furan, thiophene, benzofuran, benzothiophene, and 1,3-butadiene.

9. The photoelectric conversion element according to claim 5, wherein the hole-transporting material has a highest occupied molecular orbital level higher than the fullerene or the fullerene derivative.

10. A photoelectric conversion element comprising:
a first electrode;
a second electrode disposed to be opposed to the first electrode; and
a photoelectric conversion layer provided between the first electrode and the second electrode, the photoelectric conversion layer being formed, as a film, by a chromophore and fullerene or a fullerene derivative by means of a vacuum vapor deposition method, the chromophore and the fullerene or the fullerene derivative being bonded to each other at least partially via a crosslinking group.

11. The photoelectric conversion element according to claim 10, wherein the chromophore comprises an organic molecule having absorption in a visible-light region, and includes the crosslinking group.

12. The photoelectric conversion element according to claim 10, wherein the chromophore has a change within ±10 nm in an absorption peak wavelength before and after the bonding to the fullerene or the fullerene derivative via the crosslinking group.

13. The photoelectric conversion element according to claim 10, wherein the photoelectric conversion layer further includes a hole-transporting material.

14. A method of manufacturing a photoelectric conversion element, the method comprising:
forming a first electrode;
forming, on the first electrode, a photoelectric conversion layer that includes a chromophore, fullerene or a fullerene derivative, and a hole-transporting material, the chromophore and the fullerene or the fullerene derivative being bonded to each other at least partially via a crosslinking group; and
forming a second electrode on the photoelectric conversion layer.

15. The method of manufacturing the photoelectric conversion element according to claim 14, wherein the formation of the photoelectric conversion layer includes using a vacuum vapor deposition method.

16. The method of manufacturing the photoelectric conversion element according to claim 14, wherein the bonding between the chromophore and the fullerene or the fullerene derivative via the crosslinking group is performed by heat or light irradiation upon vacuum vapor deposition or by heating or light irradiation after film formation.

17. A method of manufacturing a photoelectric conversion element, the method comprising:
forming a first electrode;
forming, on the first electrode, a photoelectric conversion layer that includes a chromophore and fullerene or a fullerene derivative, the chromophore and the fullerene or the fullerene derivative being bonded to each other at least partially via a crosslinking group; and
forming a second electrode on the photoelectric conversion layer.

18. The method of manufacturing the photoelectric conversion element according to claim 17, wherein the formation of the photoelectric conversion layer further includes addition of a hole-transporting material.

* * * * *